(12) United States Patent
Ren et al.

(10) Patent No.: US 9,905,744 B2
(45) Date of Patent: Feb. 27, 2018

(54) SYSTEMS AND METHODS FOR THE SYNTHESIS OF HIGH THERMOELECTRIC PERFORMANCE DOPED-SNTE MATERIALS

(71) Applicant: University of Houston System, Houston, TX (US)

(72) Inventors: Zhifeng Ren, Houston, TX (US); Qian Zhang, Houston, TX (US); Gang Chen, Cambridge, MA (US)

(73) Assignees: UNIVERSITY OF HOUSTON SYSTEM, Houston, TX (US); MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 560 days.

(21) Appl. No.: 14/307,111

(22) Filed: Jun. 17, 2014

(65) Prior Publication Data

US 2014/0366924 A1    Dec. 18, 2014

Related U.S. Application Data

(60) Provisional application No. 61/835,984, filed on Jun. 17, 2013.

(51) Int. Cl.
  *H01L 35/16* (2006.01)
  *H01L 35/34* (2006.01)

(52) U.S. Cl.
  CPC .............. *H01L 35/16* (2013.01); *H01L 35/34* (2013.01)

(58) Field of Classification Search
  CPC ................................. H01L 35/16; H01L 35/34

USPC ........................................................ 136/200
See application file for complete search history.

(56) References Cited

U.S. PATENT DOCUMENTS

| | | |
|---|---|---|
| 2009/0178700 A1 | 7/2009 | Heremans et al. |
| 2011/0240081 A1 | 10/2011 | Rhyee et al. |
| 2011/0248209 A1 | 10/2011 | Androulakis et al. |
| 2012/0090656 A1 | 4/2012 | Snyder et al. |

OTHER PUBLICATIONS

Brebrick, R.F., et al., "Anomalous Thermoelectric Power as Evidence for Two-Valence Bands in SnTe," Physical Review, vol. 131, No. 1, Jul. 1, 1963, p. 104-110 (7 p.).
PCT/US2014/042765 International Search Report and Written Opinion dated Apr. 23, 2015 (14 p.).

*Primary Examiner* — Tae-Sik Kang
(74) *Attorney, Agent, or Firm* — Conley Rose, P.C.

(57) ABSTRACT

A thermoelectric composition comprising tin (Sn), tellurium (Te) and at least one dopant that comprises a peak dimensionless figure of merit (ZT) of 1.1 and a Seebeck coefficient of at least 50 μV/K and a method of manufacturing the thermoelectric composition. A plurality of components are disposed in a ball-milling vessel, wherein the plurality of components comprise tin (Sn), tellurium (Te), and at least one dopant such as indium (In). The components are subsequently mechanically and thermally processed, for example, by hot-pressing. In response to the mechanical-thermally processing, a thermoelectric composition is formed, wherein the thermoelectric composition comprises a dimensionless figure of merit (ZT) of the thermoelectric composition is at least 0.8, and wherein a Seebeck coefficient of the thermoelectric composition is at least 50 μV/K at any temperature.

6 Claims, 26 Drawing Sheets

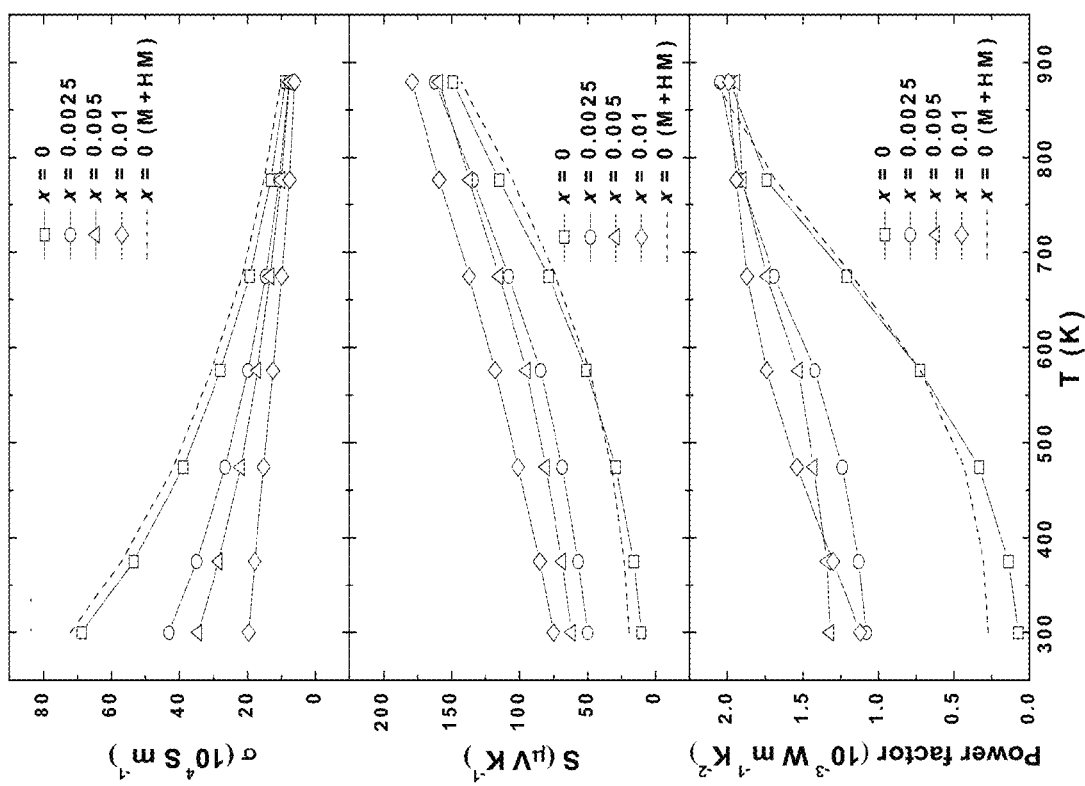

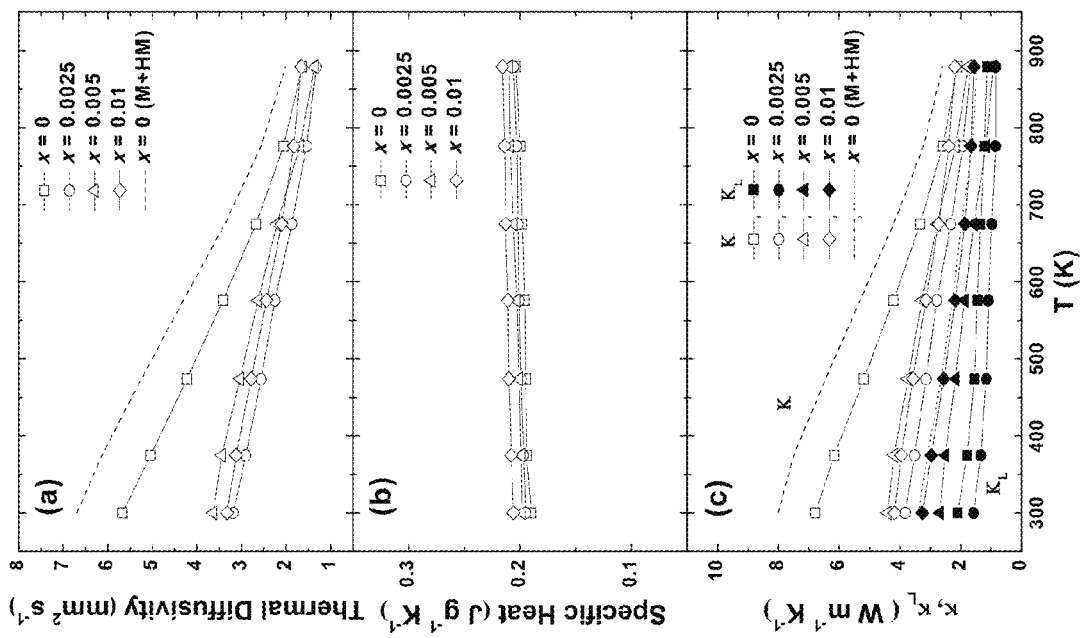

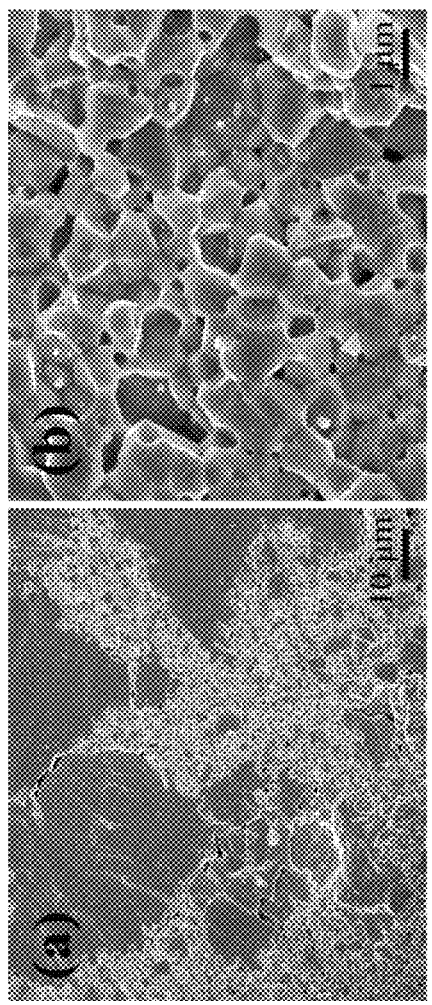
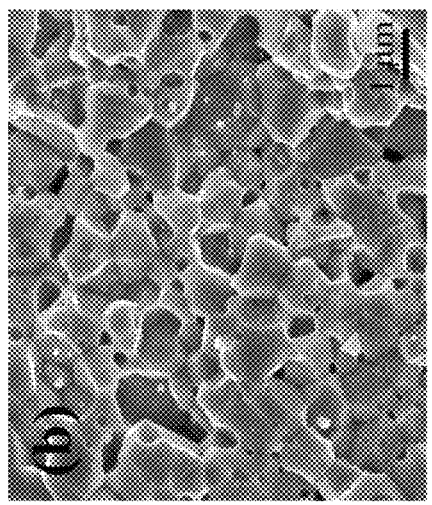
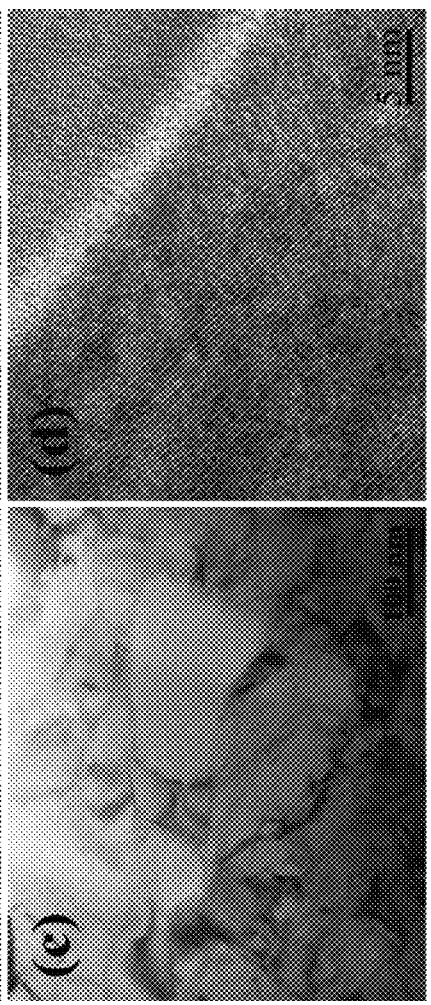
FIG. 7A  FIG. 7B  FIG. 7C  FIG. 7D

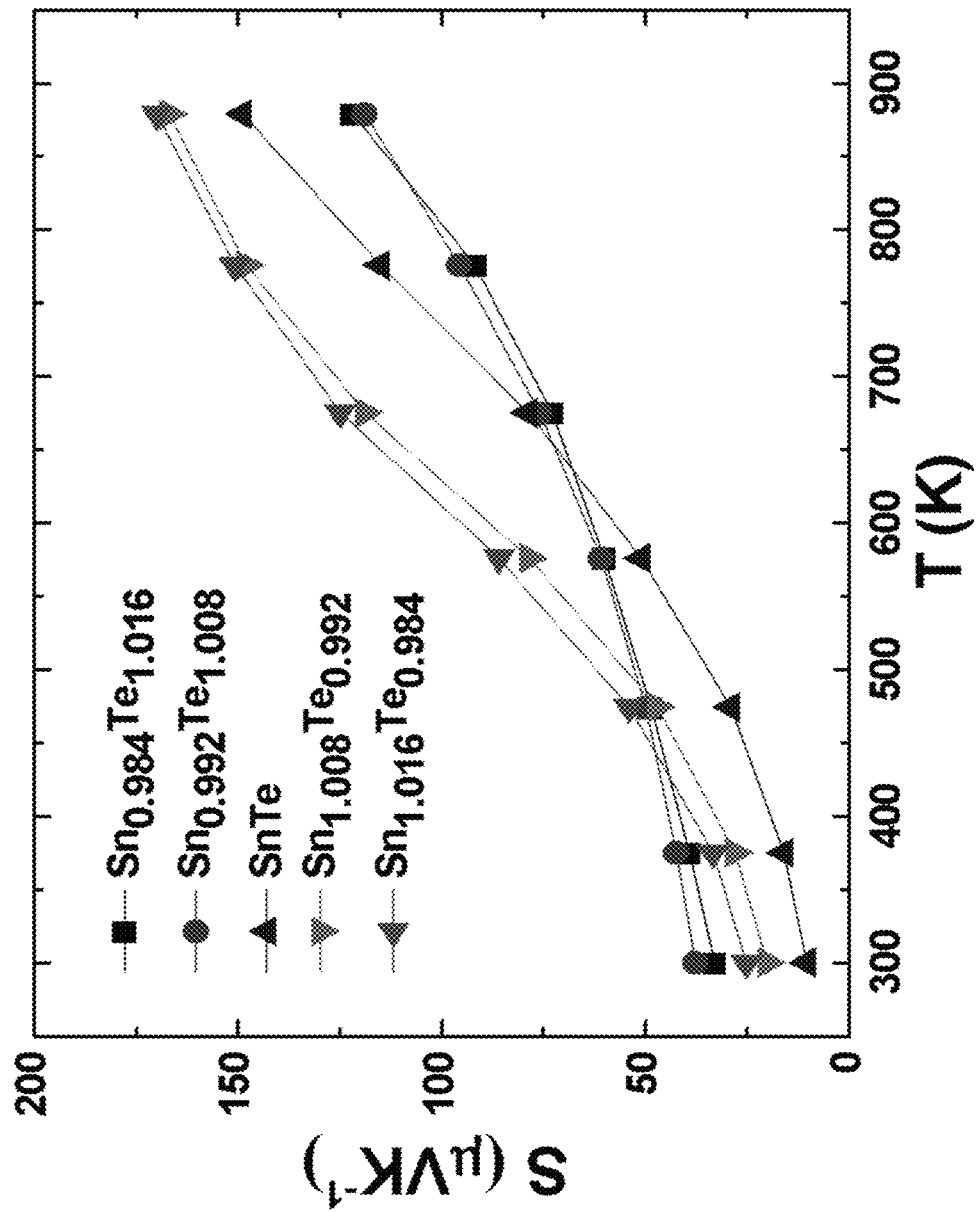

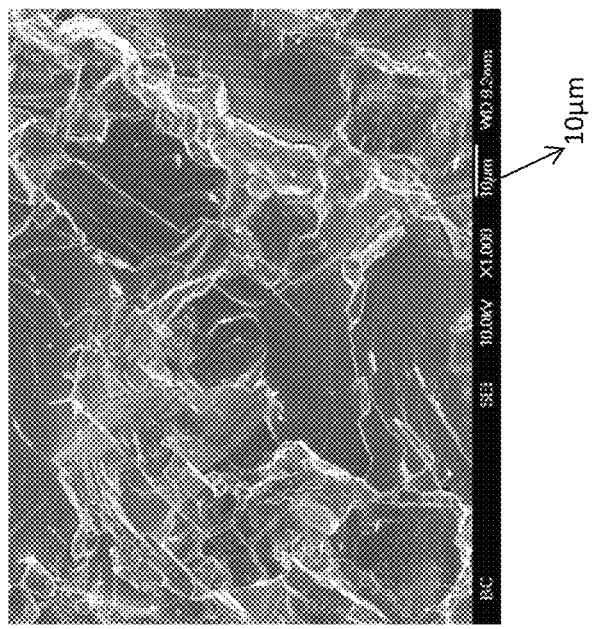
FIG. 12B – 6 hrs
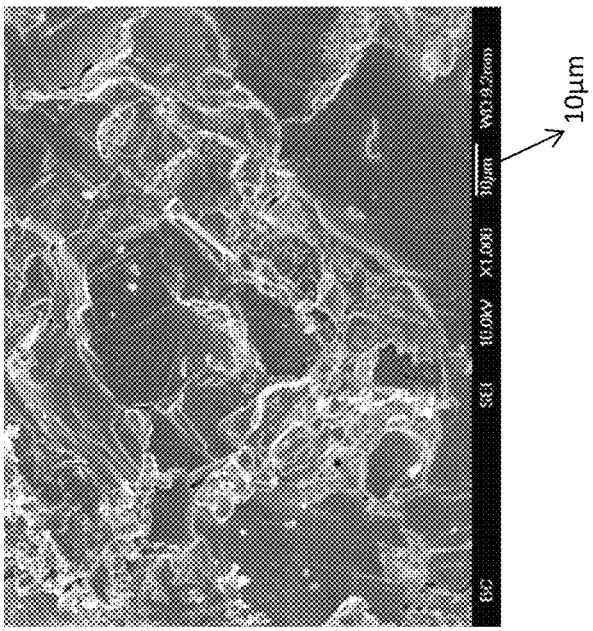
FIG. 12A – 3 hrs

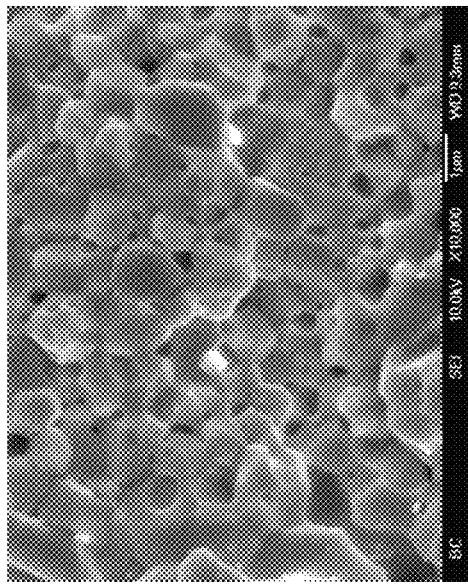
FIG. 12D – 12 hrs
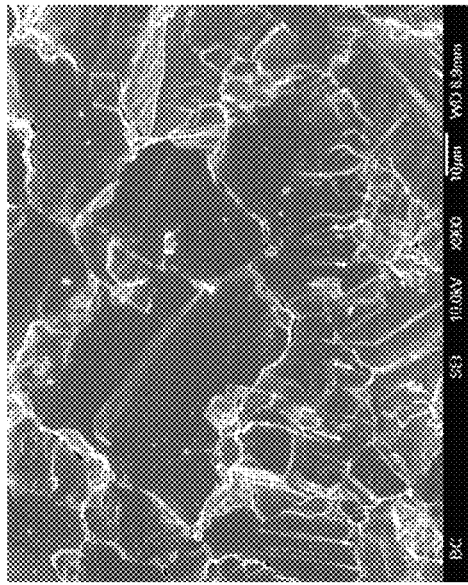
FIG. 12C – 9 hrs
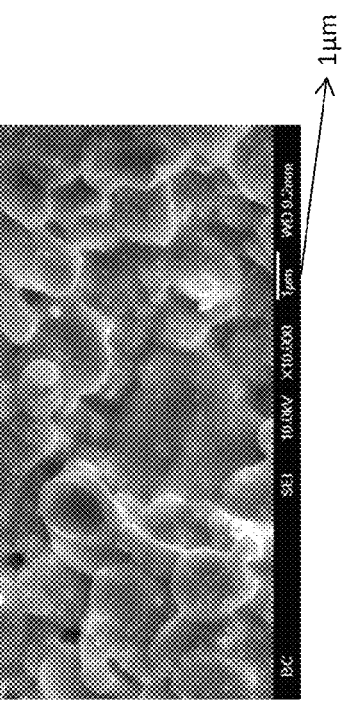
FIG. 12E – 15 hrs

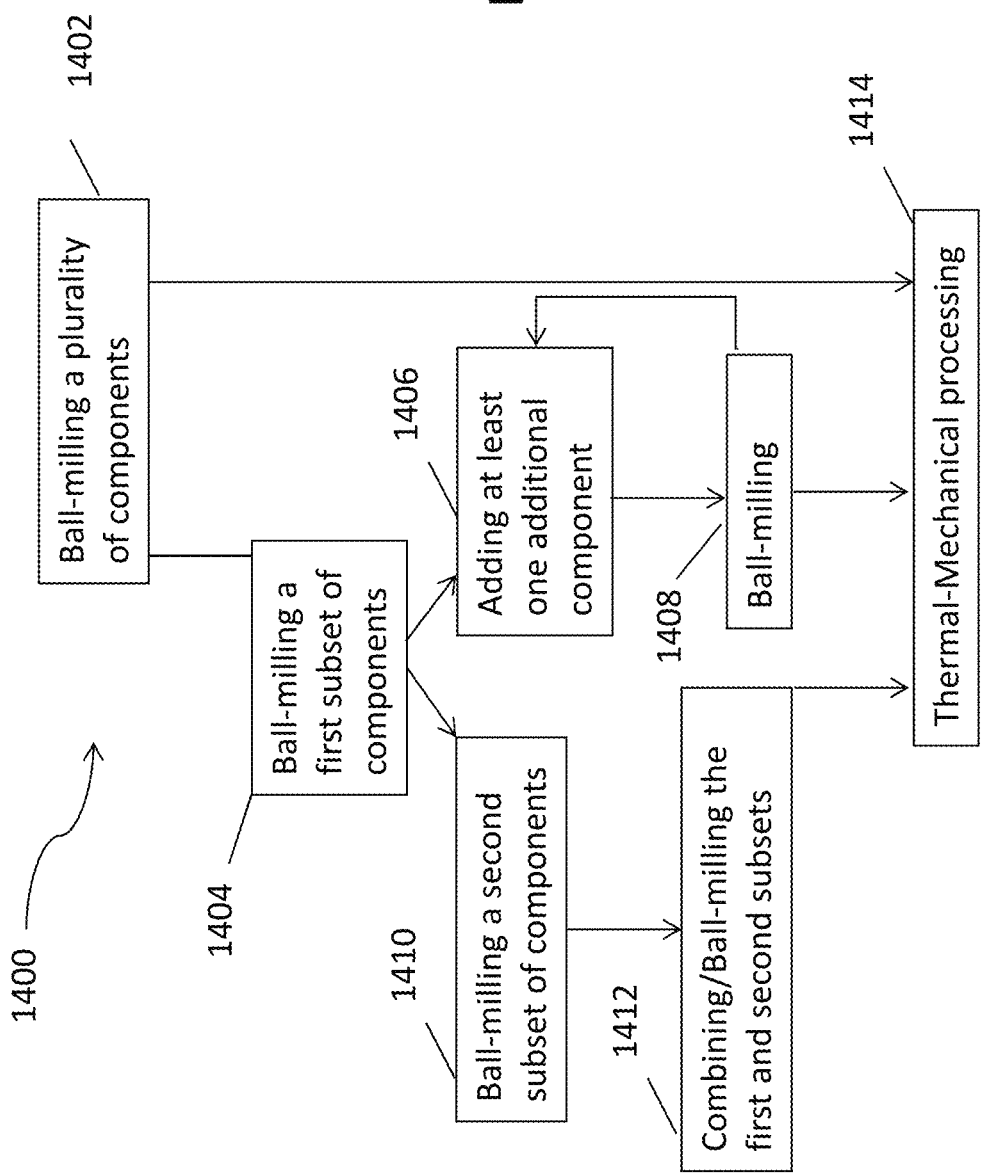

SYSTEMS AND METHODS FOR THE SYNTHESIS OF HIGH THERMOELECTRIC PERFORMANCE DOPED-SNTE MATERIALS

CROSS-REFERENCE TO RELATED APPLICATIONS

This application claims priority to and incorporates herein in its entirety U.S. Prov. App. No. 61/835,984, Ren et. al, "High Thermoelectric Performance of Doped SnTe Materials," filed Jun. 17, 2013.

STATEMENT REGARDING FEDERALLY SPONSORED RESEARCH OR DEVELOPMENT

This work is supported by "Solid State Solar Thermal Energy Conversion Center (S$^3$TEC)", an Energy Frontier Research Center funded by the U.S. Department of Energy, Office of Science, Office of Basic Energy Science under award number DE-SC0001299.

BACKGROUND

Field of the Disclosure

The disclosure relates generally to thermoelectric materials and the manufacture of thermoelectric materials. More particularly, the disclosure relates to thermoelectric materials that maintain thermoelectric properties at high temperatures.

Background of the Technology

Thermoelectric materials are those where either a temperature difference creates an electric potential or where an electric potential creates a temperature difference. Conventionally, most materials may have a thermoelectric effect but it may occur within a small temperature range that may not be appropriate for a wide range of applications, and/or may not be a strong enough thermoelectric effect to be used in industrial applications.

BRIEF SUMMARY OF THE DISCLOSURE

In an embodiment, a thermoelectric composition comprising: tin (Sn), tellurium (Te), and indium (In); wherein the amount of the indium is from about 0.01 atomic % (at. %) to about 1.0 at. %; and wherein a Seebeck coefficient of the thermoelectric composition is at least about 50 µV/K.

In an alternate embodiment, a thermoelectric composition comprising: tin (Sn), tellurium (Te), and indium (In); wherein the amount of the indium is from about 0.01 at. % to about 1.0%; wherein a dimensionless figure of merit (ZT) of the thermoelectric composition is at least about 0.8; and wherein the thermoelectric composition does not comprise lead (Pb).

In an embodiment, a method of manufacturing a thermoelectric composition comprising: ball-milling a plurality of components in a ball-milling vessel, wherein the plurality of components comprise tin (Sn), tellurium (Te), and at least one dopant; subsequently, mechanical-thermally processing the components; and forming, in response to the mechanical-thermally processing, a thermoelectric composition, wherein the thermoelectric composition comprises a dimensionless figure of merit (ZT) of the thermoelectric composition is at least 0.8, and wherein a Seebeck coefficient of the thermoelectric composition is at least 50 µV/K.

The exemplary embodiments described herein comprise a combination of features, characteristics and advantages intended to address various shortcomings associated with certain prior compositions, devices, systems, and methods. The various features and characteristics described above, as well as others, will be readily apparent to those of ordinary skill in the art upon reading the following detailed description, and by referring to the accompanying drawings. It is to be understood that the conception and the specific embodiments disclosed may be readily utilized as a basis for modifying or designing other compositions, apparatuses, structures and/or methods for carrying out the same or similar purposes as described with respect to the embodiments disclosed herein. It should also be understood that such equivalent compositions, apparatuses, structures and/or methods do not depart from the spirit and scope of the invention as set forth in the appended claims.

BRIEF DESCRIPTION OF THE DRAWINGS

For a detailed description of the disclosed exemplary embodiments of the invention, reference will now be made to the accompanying drawings in which:

FIGS. 2A-2C illustrate the effect of increasing temperature on the Seebeck coefficient, electrical conductivity, and power factor for doped SnTe according to certain embodiments of the present disclosure.

FIGS. 6A-6C illustrate the temperature dependencies of thermal diffusivity, specific heat, total thermal conductivity, and lattice thermal conductivity for doped and un-doped materials according to certain embodiments of the present disclosure.

FIGS. 7A-7D illustrate SEM, TEM, HRTEM images for indium-doped SnTe samples according to certain embodiments of the present disclosure.

FIGS. 10A-10E illustrate thermoelectric properties of samples of SnTe of varying compositions synthesized according to certain embodiments of the present disclosure.

FIGS. 12A-12E are SEM images of In-doped SnTe samples ball-milled for various times and synthesized according to certain embodiments of the present disclosure.

FIG. 14 is a flow chart of a method of manufacturing doped SnTe thermoelectric compositions according to certain embodiments of the present disclosure.

DETAILED DESCRIPTION OF THE DISCLOSED EMBODIMENTS

Figure 1A:
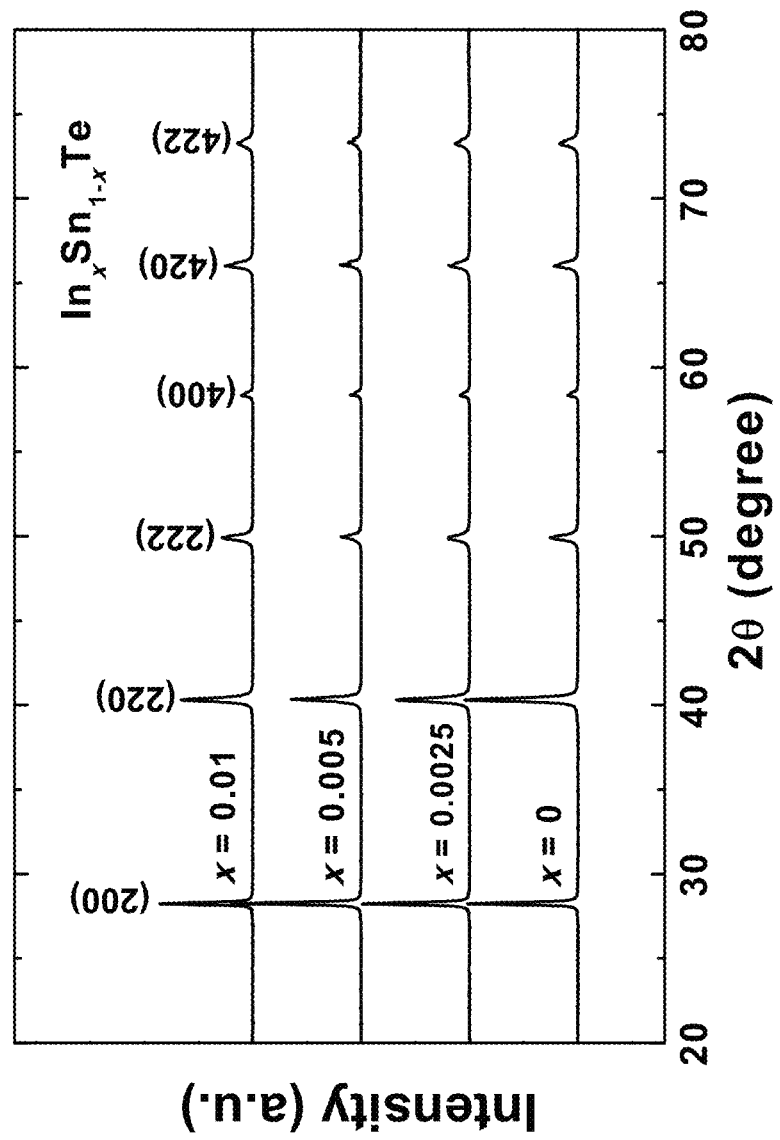
FIG. 1A is an illustration of an x-ray diffraction pattern of a plurality of In—Sn—Te compounds according to certain embodiments of the present disclosure.

The following discussion is directed to various exemplary embodiments. However, one skilled in the art will understand that the examples disclosed herein have broad application, and that the discussion of any embodiment is meant only to be exemplary of that embodiment, and not intended to suggest that the scope of the disclosure, including the claims, is limited to that embodiment.

The drawing figures are not necessarily to scale. Certain features and components herein may be shown exaggerated in scale or in somewhat schematic form and some details of conventional elements may not be shown in interest of clarity and conciseness.

In the following discussion and in the claims, the terms "including" and "comprising" are used in an open-ended fashion, and thus should be interpreted to mean "including, but not limited to . . ." Also, the term "couple" or "couples" is intended to mean either an indirect or direct connection. Thus, if a first device couples to a second device, that connection may be through a direct connection, or through an indirect connection via other devices, components, and connections. In addition, as used herein, the terms "axial" and "axially" generally mean along or parallel to a given axis (e.g., central axis of a body or a port), while the terms "radial" and "radially" generally mean perpendicular to the given axis. For instance, an axial distance refers to a distance measured along or parallel to the given axis, and a radial distance means a distance measured perpendicular to the given axis.

This disclosure incorporates by reference in its entirety R. F. Brebrick and A. J. Strauss, (Jul. 1, 1963) Anomalous Thermoelectric Power as Evidence for Two-valence Bands in SnTe. *Phys Rev* 131 (1):104-110 (hereinafter Brebrick).

The disclosure herein is related to the formation of lead-free SnTe for use where materials with good thermoelectric conductivity demonstrated at least by high Seebeck coefficients are desired. Conventionally, lead-containing SnTe materials, for example, may be used for solid-state waste heat recovery but may lead to unfavorable environmental impacts. These thermoelectric materials may also be referred to as chalcogenides which are compounds comprising at least one electropositive ion in addition to at least one chalcogen ion, for example, from a group 16 element such as sulfur (S), selenium (Se), and tellurium (Te).

EXPERIMENTAL METHODS

Synthesis. A plurality of samples of $In_xSn_{1-x}Te$ were prepared according to embodiments of the present disclosure. The plurality of samples were fabricated comprising nominal compositions $In_xSn_{1-x}Te$, where =0, 0.001, 0.0015, 0.002, 0.0025, 0.005, 0.0075, and 0.01, respectively in each sample of the plurality of samples. These samples were prepared by directly ball milling the raw materials In (powder, 99.99%), Sn (powder, 99.9%), and Te (chunks, 99.999%) in a stainless steel jar by a high-energy ball mill SPEX 8000D (SPEX SamplePrep). The raw materials (In, Sn, and Te) were sealed inside the stainless steel jar in an Argon-filled environment. In addition to using ball milling to prepare the plurality of samples, a plurality of undoped SnTe samples of varying compositions were also prepared by melting and cooling in quartz tube followed by hand milling for comparison. Samples made in such a way are labeled as M+HM. The powder was loaded into the graphite die and consolidated by direct current (DC) induced hot pressing.

Calculations. Density functional theory (DFT) based calculations were carried out to answer a plurality of questions including: 1) whether In atoms substitute for tin or tellurium in the structure; 2) how In atoms act as compared to Sn vacancies as p-type dopants; 3) what effects the In atoms have on the electronic structure, especially the density of states (DOS) of the pure system near the band gap.

In an embodiment, supercells were constructed consisting of 8 unit cells ($Sn_{32}Te_{32}$), and the total energy of 2 different configurations ($InSn_{31}Te_{32}$, $Sn_{32}Te_{31}In$) were calculated and compared. For comparison, the same supercell calculations were done for bismuth (Bi) doped SnTe. The Quantum Espresso package was used for the calculation, with norm-conserving pseudopotentials with the local density approximation (LDA) function. The spin-orbit interaction was taken into account, and all the supercells were fully relaxed. The cut-off energy for the planewave basis was chosen as 60 Ryd, and a 4×4×4 k-mesh was used for the self-consistent-field (SCF) calculation. In contrast, a 30×30×30 mesh was used for the non-SCF and DOS calculation. The tetrahedra method was used to integrate the density of states (DOS). The simulation results are discussed below.

Characterizations. Subsequent to the preparation of the plurality of samples, the samples were characterized, that is, a plurality of tests including x-ray diffraction, scanning electron microscopy, high-resolution transmission electron microscope, and an ULVAC were utilized to determine the properties of the samples. X-ray diffraction spectra analysis was conducted using a PANalytical multipurpose diffractometer with an X'celerator detector (PANalytical X'Pert Pro). The microstructures were characterized by a scanning electron microscope (SEM, model JEOL 6340F) and a high-resolution transmission electron microscope (HRTEM, model JEOL 2010F). The electrical resistivity ($\rho$) and Seebeck coefficient (S) were simultaneously measured on a commercial system (ULVAC ZEM-3). The thermal conductivity $\kappa$ was calculated using $\kappa = D\alpha C_p$, where D is the volumetric density determined by the Archimedes method, $\alpha$ the thermal diffusivity measured on a laser flash apparatus (Netzsch LFA 457), and $C_p$ the specific heat obtained on a differential scanning calorimetry thermal analyzer (Netzsch DSC 404 C). The Hall Coefficient $R_H$ at room temperature was measured using the PPMS (Physical Properties Measurement System, Quantum Design). The Hall carrier concentration $n_H$ and Hall mobility $\mu_H$ were calculated using $n_H = 1/(eR_H)$ and $\mu_H = \sigma R_H$.

Systems, compositions and method disclosed herein relate to the thermoelectric properties of samples of nanostructured SnTe that are synthesized with different dopants. From an environmental perspective, lead-free SnTe may be preferred for solid-state waste heat recovery if its thermoelectric figure-of-merit could be brought close to that of the lead-containing chalcogenides. The dopants that may be used in the synthesis of the nanostructured SnTe samples discussed herein include, but are not limited to, boron (B), aluminum (Al), bismuth (Bi), zinc (Zn), sodium (Na), cobalt (Co), gallium (Ga), thallium (Tl), silicon (Si), germanium (Ge), lead (Pb), or indium (In). The dopant concentration may be from about 0.01 at. % to about 0.50 at. %, and, depending upon the embodiment, may be any range within the range of about 0.01 at. % to about 0.50 at. %.

As such, some embodiments, the thermoelectric composition may not contain lead. However, in other embodiments, the dopants as discussed herein may include lead (Pb) in quantities less than about 0.50 at. % in order to reduce at least the environmental impact of the use of those thermoelectric materials.

As discussed in detail herein, indium-doped SnTe showed extraordinarily large Seebeck coefficients that may not be properly explained by the conventional two-valance-band model. Rather, the enhancement of the Seebeck coefficient may be attributed to resonant levels created by the indium impurities inside the valance band, which is supported by the first-principles simulations. The indium impurities, together with the lowered thermal conductivity resulted from the decreased grain size by ball milling and hot pressing, may have improved both the peak and average dimensionless figures of merit (ZTs) significantly. As discussed in detail herein, a peak ZT of ~1.1 was obtained in 0.25 atomic (at.) % In-doped SnTe at about 873 K. In other embodiments, the atomic % of indium or other dopant may range from about less than 1 at. % to about 10 at. %, in some embodiments, the dopant may range from about 0.01 at. % to about 1.0%. The grain size observed subsequent to ball-milling may be from about 50 nm to about 10 microns.

It is appreciated that "good" thermoelectric (TE) materials are characterized not only by a high dimensionless figure-of-merit (Z), but that, in some embodiments, the environmental impact and cost of a material may make one material more desirable than another. The dimensionless figure-of-merit (ZT) may be defined as $ZT=[S^2\sigma/(\kappa_L+\kappa_e)]T$, where S is the Seebeck coefficient, $\sigma$ is the electrical conductivity, $\kappa_L$ is the lattice thermal conductivity, $\kappa_e$ is the electronic thermal conductivity, and T is the absolute temperature.

Lead chalcogenides and their alloys can be engineered to exhibit high ZTs, however, as discussed above, lead chalceogenides may not be appropriate for all applications where thermoelectric materials are desired because the environmental concern with Pb. Tin telluride (SnTe), a lead-free IV-VI narrow band-gap semiconductor has historically not been favorably considered as a good thermoelectric material because of its low ZT due to the relatively low Seebeck coefficient and high electronic thermal conductivity caused by intrinsic Sn vacancies. The systems and methods disclosed herein may use the similarity of the electronic band structure of SnTe with that of PbTe and PbSe to make doped-SnTe a good thermoelectric material, especially given that the two valence bands (light-hole and heavy-hole bands) contribute to the hole density of states. One challenge of using SnTe materials that may be overcome by the materials and methods discussed herein may be the fact that the separation between the light-hole and heavy-hole band edges in SnTe is estimated to be in the range of about 0.3 to about 0.4 eV. This range may be larger than those of PbTe or PbSe, which may render the benefit of the Seebeck coefficient less significant. In some embodiments, the thermoelectric compositions fabricated and discussed herein may exhibit a Seebeck coefficient of at least 150.

In an embodiment, In-doped SnTe was prepared by high-energy ball milling and hot pressing and measured the samples up to 873 K without causing detriment to the mechanical strength. It is appreciated that the raw materials and/or intermediate compounds may be ball-milled for 10-20 hours, preferably from 12-15 hours, and that the ball-milling time and conditions may vary depending upon the composition of the material being ball-milled. As discussed herein, a small amount of In-doping may help to create resonant states around the Fermi level inside the valence band. These resonant states may increase the Seebeck coefficient, especially at room temperature, which may lead to improvements in both average ZT and peak ZT, combined with the decreased lattice thermal conductivity due to the increased density of grain boundaries. Peak ZT value reaches ~1.1 at about 873 K for SnTe doped with 0.25 at. % In.

FIG. 1A is an x-ray diffraction pattern of a plurality of In—Sn—Te compounds. FIG. 1A presents the XRD patterns of a plurality of samples of $In_xSn_{1-x}Te$, where x=0, 0.0025, 0.005, and 0.01, respectively. All the peaks ((200), (220), (222), (400), (420), and (422)) can be indexed to the face-centered structure (space group Fm$\bar{3}$m). No impurity phase was found in spite of the increasing content of In in the plurality of samples. The first principal calculations indicated that it may generally be energetically favorable for In to substitute for Sn, which is consistent with the case in In-doped PbTe and PbSe. It is appreciated that, while In may have been used previously to substitute Pb in PbTe and PbSe, that was n-type doping in $In_xPb_{1-x}Te$ and $In_xPb_{1-x}Se$, which is different from p-type doping by In in SnTe as discussed herein.

Figure 1B:
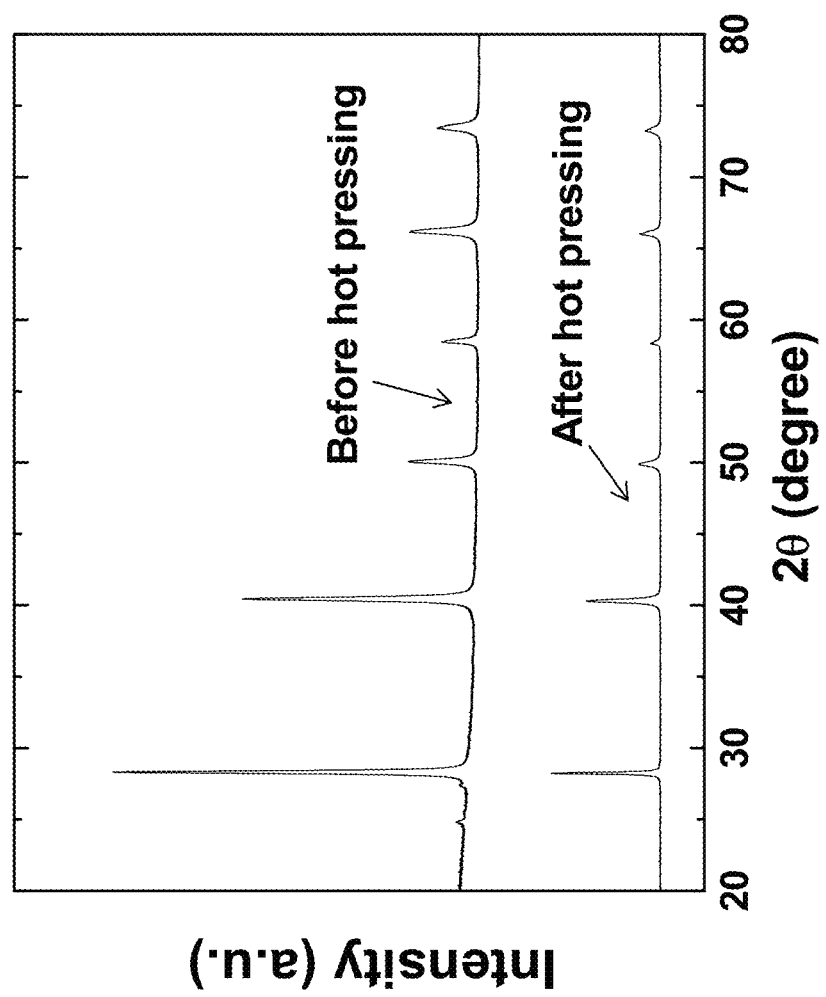
FIG. 1B is an illustration of x-ray diffraction patterns of samples of In—Sn—Te before and after hot-pressing according to certain embodiments of the present disclosure.

FIG. 1B is an illustration of x-ray diffraction patterns of samples of In—Sn—Te before hot-pressing and after hot-pressing. In an embodiment as pictured in FIG. 1B, the desired phase or phases may be present in the compound subsequent to ball-milling, i.e., prior to hot-pressing. While it may be desirable to form the desired phase or phases during ball-milling as shown in FIG. 1B, in alternate embodiments the desired phase or phases may be formed in whole or in part during the mechanical-thermal processing. The term "mechanical-thermal processing" is used herein to refer to processes including but not limited to hot-pressing wherein pressure is applied to a sample by mechanical means and a temperature change may or may not be used as part of that process. In other embodiments, more than one mechanical-thermally processing step may be used such as annealing, tempering, rolling, drawing, hot pressing, cold-pressing, extrusion, the application of compressive pressure, the application of tensile pressure, grinding, and other processes, the selection of which may depend upon the material composition, end use/end product/end application, and/or other factors.

Figures 3A, 3B:
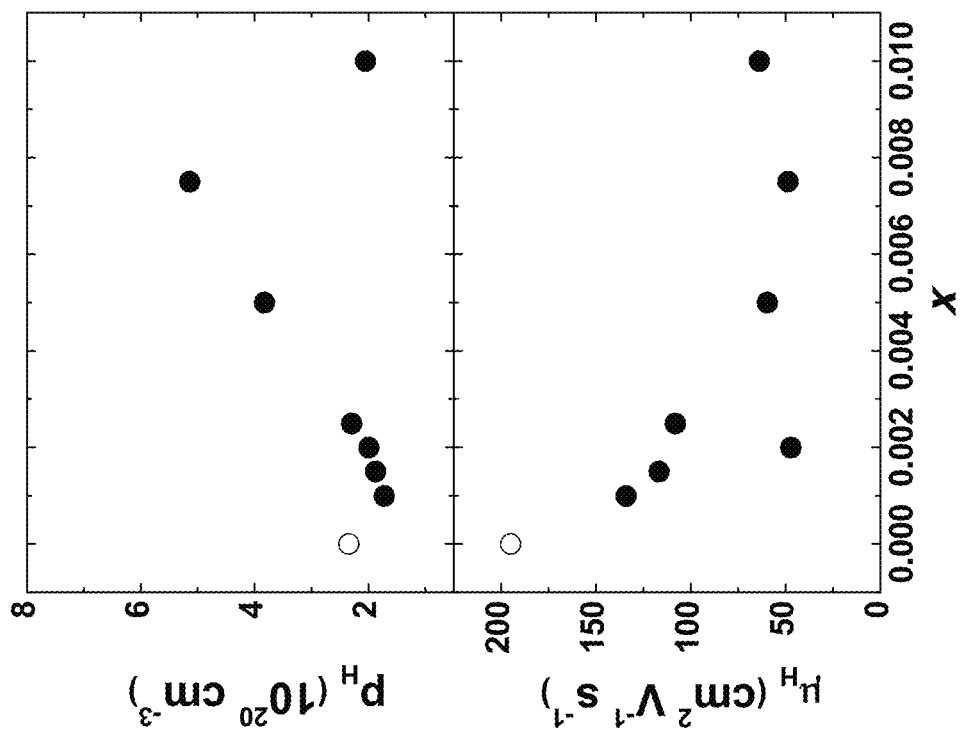
FIGS. 3A and 3B illustrate the Hall carrier concentration and the Hall mobility at room temperature as compared to the content of dopant according to certain embodiments of the present disclosure.

FIGS. 2A-2C illustrate the effect of increasing temperature on the electrical conductivity, Seebeck coefficient, and power factor for doped SnTe. FIGS. 3A and 3B illustrate the Hall carrier concentration and the Hall mobility at room temperature as the dependence of the content of dopant. As shown in FIG. 2A, the electrical conductivities decrease with increasing temperature as is the typical behavior of degenerate semiconductors. With the increasing content of the dopant, in this case indium (In), the electrical conductivity decreases, especially at room temperature, from $\sim7\times10^5$ S m$^{-1}$ to $\sim2\times10^5$ S m$^{-1}$.

The hole concentration (measured by $10^{20}$ cm$^{-3}$) is indicated by the Hall measurements in FIGS. 3A and 3B. However, this hole concentration ($p_H$) may change with increasing indium (In) content (x). As shown in FIG. 3A, the hole concentration ($p_H$) drops below the intrinsic value at the beginning, and starts to rise after x>0.002. Based on this observation, In atoms may be desirable as p-type dopants and the change of the carrier concentration may be explained with respect to the Sn vacancies. The intrinsic SnTe shown in FIGS. 3A and 3B is p-type due to the Sn vacancies. Those Sn vacancies create empty electronic states and behave like p-type dopants. For example, if SnTe is doped with In, the In atoms first fill the Sn vacancies. In spite of being p-type dopants, the indium atoms may not be as "strong" as the vacancies in the sense that they induce less holes and thus at low doping levels, the p-type charge concentration decreases. However, as the doping level is increased, the Sn vacancies are filled with In. Beyond the point in the doping level where substantially all of the Sn vacancies are filled with In, excessive In atoms may substitute for Sn, and the p-type charge concentration increases again, as shown in FIG. 3A.

The fact that the electrical conductivity ($\sigma$) substantially decreases indicates that the In dopants may affect the hole mobility significantly as shown in FIG. 3B. This effect may be due to both increased effective mass and impurity scattering. The Seebeck coefficients increase with temperature in the tested temperature range and also increase with the increasing In content as shown in FIG. 2B. No bipolar effect is evident even up to 873 K in all the compositions despite the small band gap ~0.18 eV for SnTe.

Figure 4:
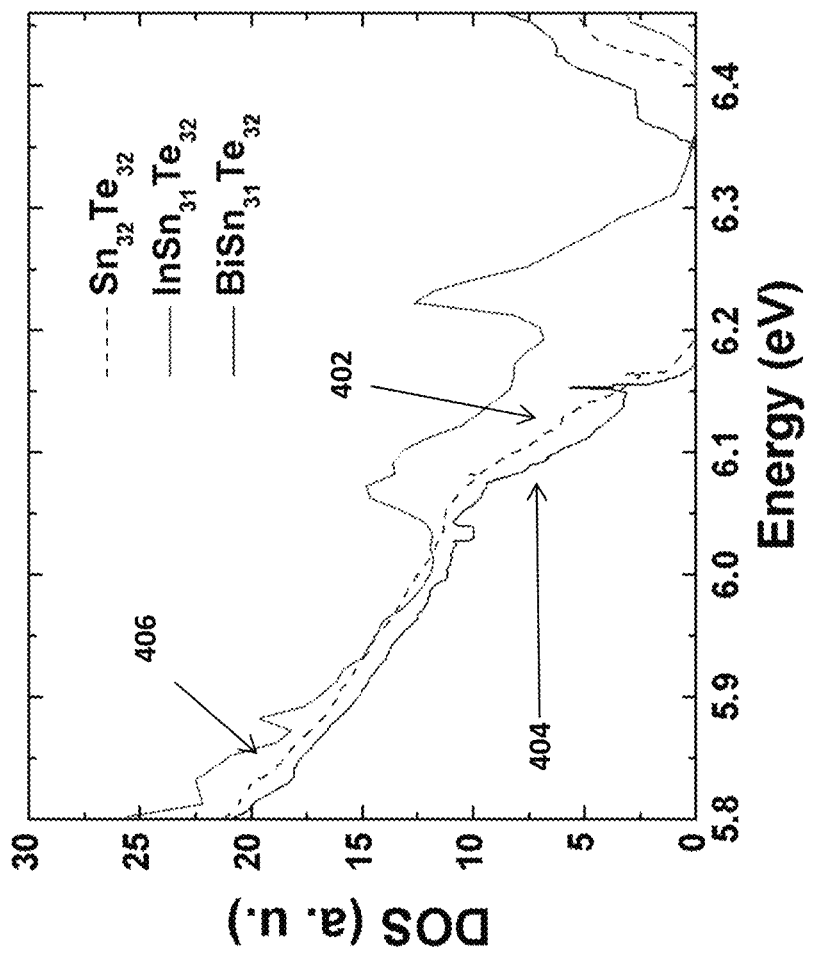
FIG. 4. illustrates a comparison of the density of states (DOS) for undoped SnTe, Bi-doped SnTe, and In-doped SnTe according to certain embodiments of the present disclosure.

FIG. 4. illustrates a comparison of the density of states (DOS) for undoped SnTe, Bi-doped SnTe, and In-doped SnTe. FIG. 4 shows the DOS of pure SnTe, Bi-doped SnTe and In-doped SnTe near the top of the valance band. The undoped $Sn_{32}Te_{32}$ is indicated by a dotted line, the Bi-doped $Sn_{31}Te_{32}$ is indicated by 404, and the In-doped $Sn_{31}Te_{32}$ is indicated by 406. Sharp features are observed in the DOS of In-doped SnTe 406 near the band edge, which results in the higher Seebeck coefficient. All the measured Seebeck coefficients are positive, consistent with the DOS calculation presented in FIG. 4 and different from In-doped PbTe and PbSe, where In turned out to be an n-type dopant. FIG. 2C illustrates the power factors for undoped and In-doped SnTe. The highest power factor reaches ~$2.0\times10^{-3}$ W m$^{-1}$ K$^{-2}$ at about 873 K, which is higher than all the conventionally observed power factors of doped PbTe and PbSe at a similar temperature. The average power factor is increased by In doping. Compared with the undoped SnTe 402 prepared by melting and hand milling (M+HM), the electrical properties of the ball-milled samples are not different. A well-defined peak is observed in the DOS of In-doped SnTe 406 that can contribute to the large deviation of the Seebeck coefficient from the VBM model. One may question that the observed features are due to the limited size of the supercell and thus the artificial interactions between In atoms. Similar features, however, are not observed in Bi-doped SnTe 404 with the same supercell size, in which case instead, a highly localized impurity band emerges in the conduction band.

Figure 5:
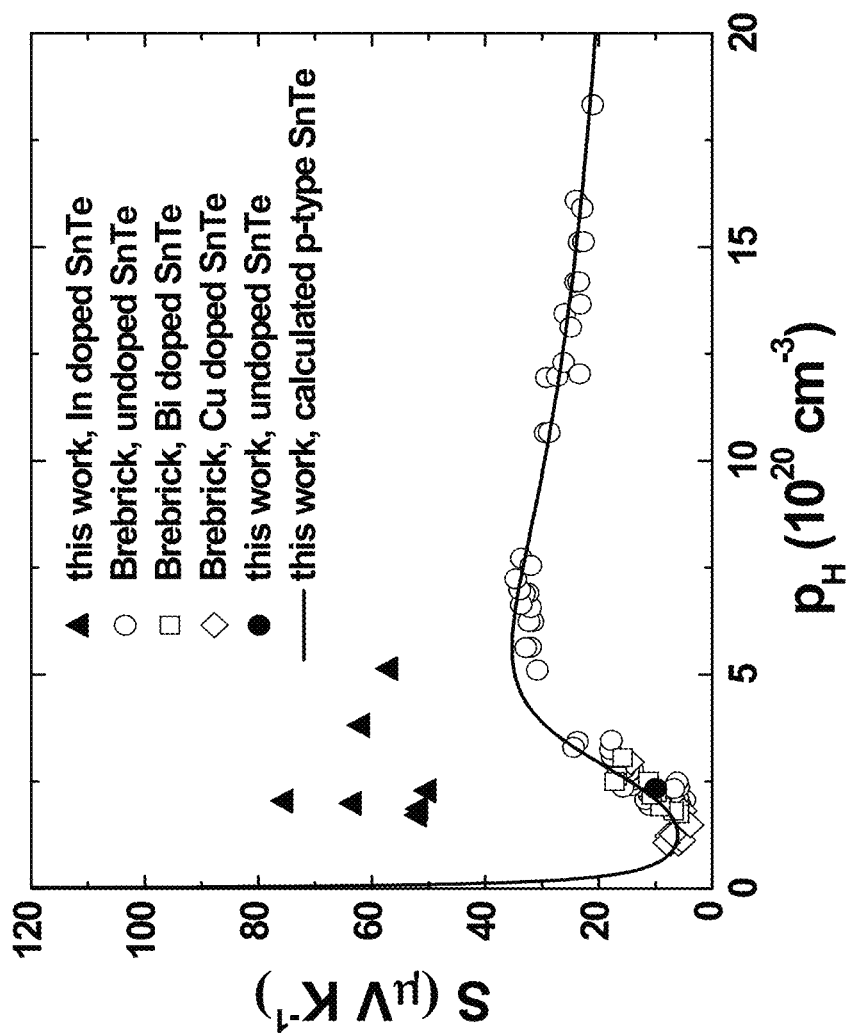
FIG. 5 is a chart illustrating the variation of the Seebeck coefficient vs. carrier concentration for both pure SnTe and In-doped SnTe according to certain embodiments of the present disclosure.

FIG. 5 is a chart illustrating the variation of the Seebeck coefficient vs. carrier concentration for both pure SnTe and In-doped SnTe. It is noted that FIG. 5 compares the work of the incorporated reference materials (Brebrick) to that of the work disclosed herein ("this work"). The hollow circle, square, and diamond indicate the trends in the variation of the Seebeck coefficient (S) with increasing carrier concentration ($p_H$) in previous studies (Brebrick), and the solid line, squares, and triangles indicate Seebeck coefficient results from samples fabricated according to certain embodiments of the present disclosure. The Seebeck coefficients of undoped SnTe with different hole concentrations ($2\times10^{20}$-$1.8\times10^{21}$ cm$^{-3}$) were previously obtained by annealing under different conditions and are indicated by the open circles. The carrier concentration obtained in this work is ~$2.35\times10^{20}$ cm$^{-3}$ and is indicated by the filled circle. Unlike PbTe and PbSe, the Seebeck coefficient of SnTe shows abnormal variation with increasing carrier concentration, which was previously qualitatively explained by two parabolic bands model and density functional theory calculations. The valence band model (VBM), which takes into account the nonparabolicity of the light-hole band indicated by the solid line, provides a quantitative fit to all the Seebeck coefficient data except for those of In-doped samples and thus is expected to best depict the contribution from the intrinsic band structure of SnTe. As such, the In-doped sample indicated by the solid triangular data points has better (higher) S values than the VBM (theoretical data).

Comparing FIG. 5 to the same model used for PbTe and PbSe, two major differences are noted. The first difference is that the L point energy gap, Eg, is smaller for SnTe, making the nonparabolicity larger. This makes the Seebeck drop faster with increasing concentration. The light-hole-heavy-hole band edge energy difference is 0.12 eV for PbTe, 0.26 eV for PbSe, and 0.35 eV for SnTe, and thus the heavy-hole contribution may be relatively weaker for SnTe. This can be seen from the fact that there is not much difference between the predictions of VBM and the two-band Kane (TBK) model (which ignores the heavy-hole band contribution) at room temperature for SnTe, until $10\times10^{19}$ cm$^{-3}$. However, the contribution from the heavy-hole band gradually increases at higher temperatures. As for PbSe helping improve the Seebeck coefficient at high temperature and suppress the bipolar effect. While the Seebeck coefficients of Bi and Cu doped samples agree well with the VBM model as shown in FIG. 5, indicating pure doping effects, the deviation of the In-doped samples from the VBM model implies that there must be mechanisms through which In dopants alter the band structure of pure SnTe near the band edge significantly. One of the possible mechanisms is the introduction of resonant levels into the valance band. As discussed above with respect to FIG. 4, a well-defined peak is observed in the DOS of In-doped SnTe that can contribute to the large deviation of the Seebeck coefficient from the VBM model. Therefore the added feature may originate from the interactions of the In atoms with the host atoms. However, the rich features introduced by In atoms may play an important role in the enhanced thermoelectric properties.

FIGS. 6A-6C illustrate the temperature dependencies of thermal diffusivity, specific heat, total thermal conductivity, and lattice thermal conductivity for doped and un-doped materials. The systems, methods, and materials discussed herein may resolve the high thermal conductivity induced by intrinsic Sn vacancies causing very high electrical conductivity. By doping with In, or in other embodiments possibly using dopants such as boron (B), aluminum (Al), gallium (Ga), thallium (Tl), silicon (Si), germanium (Ge)), the decreased electrical conductivity results in a reduced electronic part of the thermal conductivity determined by the Wiedemann-Franz law ($\kappa_e = L\sigma T$, where L is the Lorenz number.

FIGS. 6A-6C give the temperature dependences of the thermal diffusivity, specific heat, total thermal conductivity and lattice thermal conductivity (obtained by subtracting the electronic contribution from the total thermal conductivity) of the undoped and In-doped SnTe, respectively. With increasing temperature, the total thermal conductivity decreases rapidly without showing any bipolar effect, consistent with the behavior of the Seebeck coefficient in FIG. 2B. The total thermal conductivities of all the In-doped SnTe are lower than the undoped sample. Compared with the undoped SnTe prepared by melting and hot pressing (dotted line), the samples prepared by ball milling and hot pressing exhibit lower lattice thermal conductivity, which can be attributed to the increased density of grain boundaries by ball milling.

FIGS. 7A-7D illustrate SEM, TEM, HRTEM images for indium-doped SnTe samples. The images in FIGS. 7A-7D are representative microstructures of ball milled and hot pressed In-doped SnTe. Scanning electron microscopic (SEM) images shown in FIG. 7A indicate that the $In_{0.0025}Sn_{0.9975}Te$ samples consist of both big grains with diameters of several tens of microns and small grains. The size of the small grains is about one micron as shown in FIG. 7B, less than one tenth of the big grains. Nano grains in the samples are also observed via transmission electron microscopy (TEM).

FIG. 7C shows a typical bright-field TEM image of the nano grains with sizes around 100 nm. As a result, the lattice thermal conductivity of the samples may be greatly reduced by significantly enhanced boundary scatterings of the phonons, as shown in FIG. 6C. Selected area electron diffraction and high-resolution TEM (HRTEM) images show that all the grains, whether in microns or nanometers, are single crystals with clean boundaries and good crystallinity, as shown in FIG. 7D. The crystalline grains and boundaries would benefit the transport of charge carriers, as observed in nanograined $Bi_xSb_{2-x}Te_3$ bulks, without degrading the electronic properties (See FIG. 2).

Figure 8:
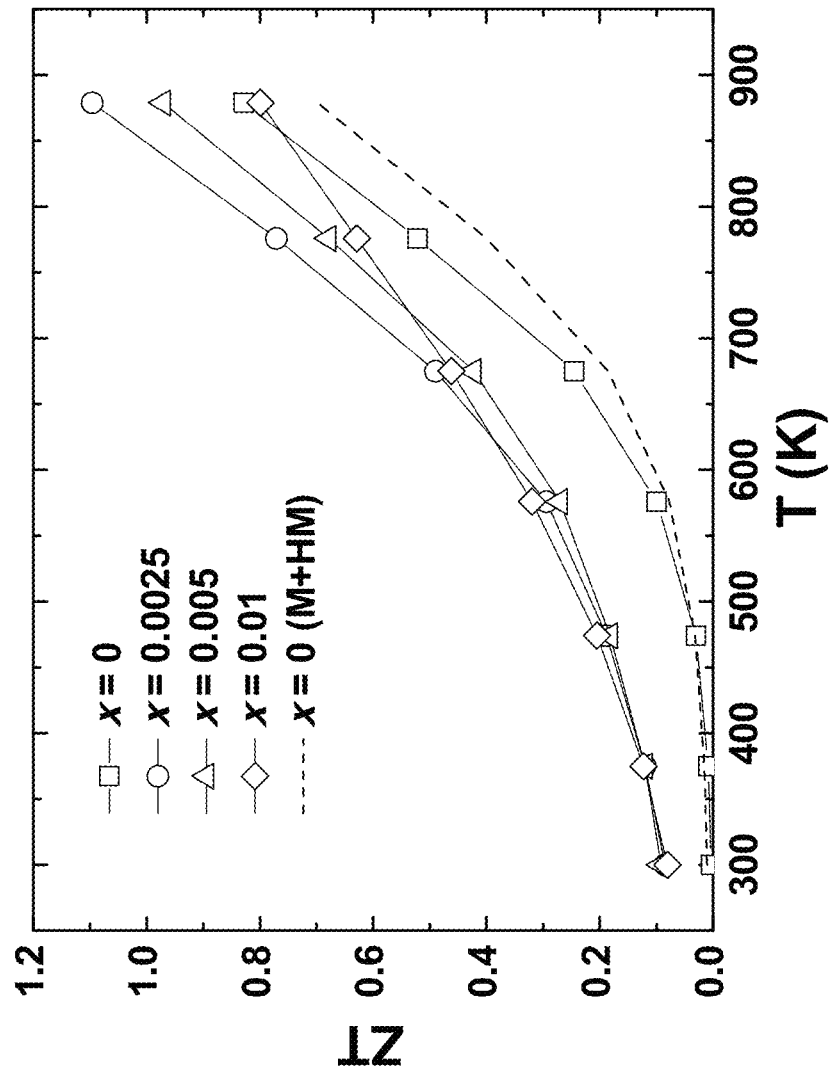
FIG. 8 illustrates the temperature dependence of the dimensionless figure of merit (ZT).

FIG. 8 illustrates the temperature dependence of the dimensionless figure of merit (ZT). FIG. 8 shows the temperature dependence of ZT for $In_xSn_{1-x}Te$ (x=0, 0.0025, 0.005, and 0.01). The undoped SnTe prepared by melting and hot pressing is included for comparison and is indicated by the dashed line. The two intrinsic valence bands contribute to the peak ZT value of about 0.7 at about 873 K for the undoped SnTe. The decreased lattice thermal conductivity by ball milling further boosts the peak ZT value to about 0.8. However, the ZT values in both cases are quite low below 600 K, resulting in low average ZTs. Due to the enhanced Seebeck coefficient by resonant states, both the peak and average ZTs are increased in the In-doped nanostructured SnTe. A peak ZT of about 1.1 is obtained at about 873 K in $In_{0.0025}Sn_{0.9975}Te$.

Figure 9A:
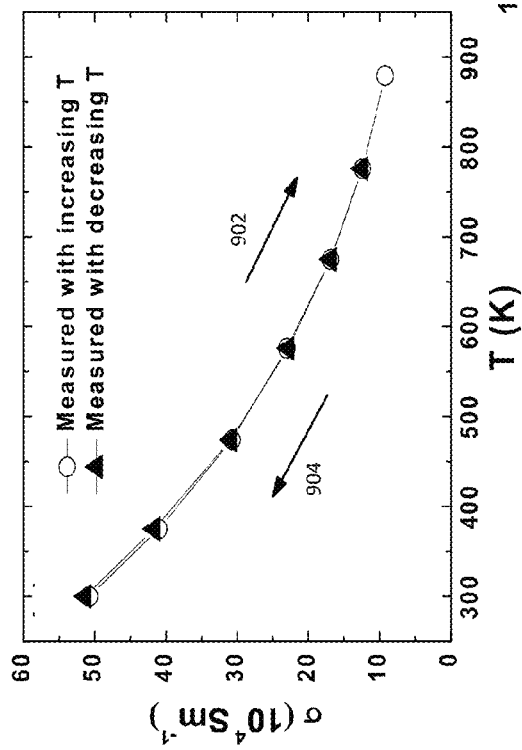
FIGS. 9A-9F illustrate thermal stability of a sample of IN-doped SnTe synthesized according to certain embodiments of the present disclosure.
Figure 9B:
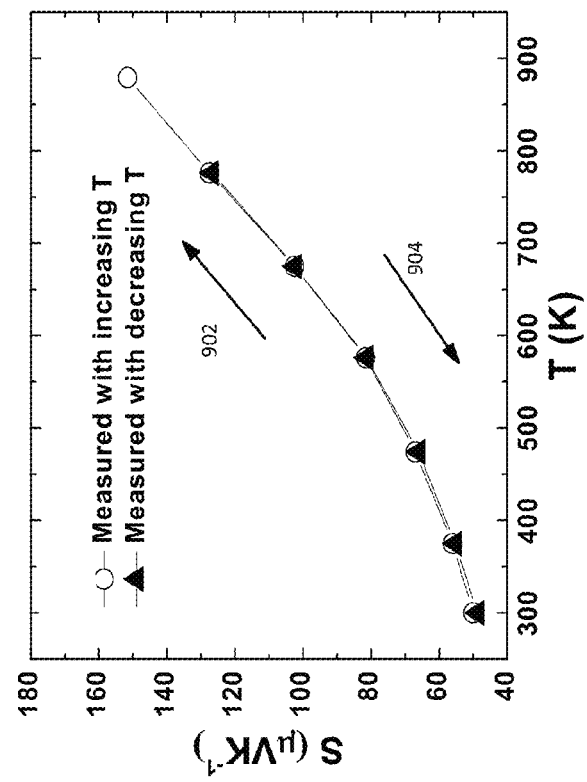
Figure 9C:
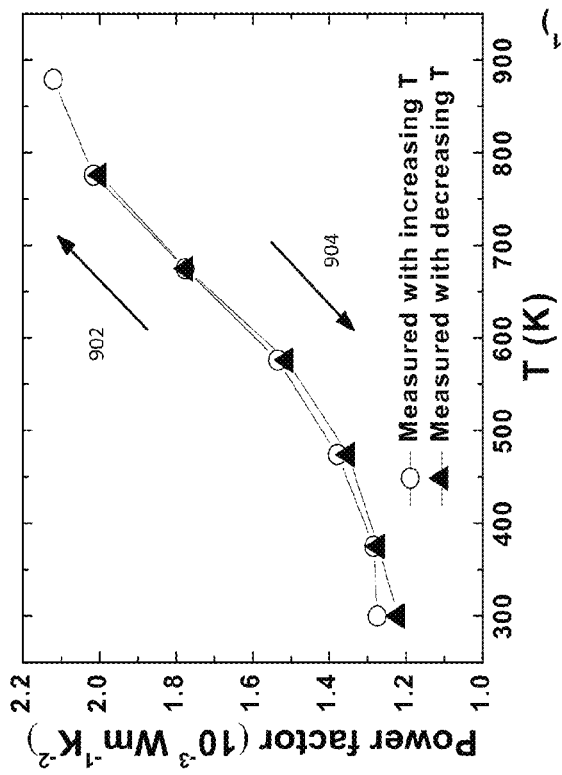
Figure 9D:
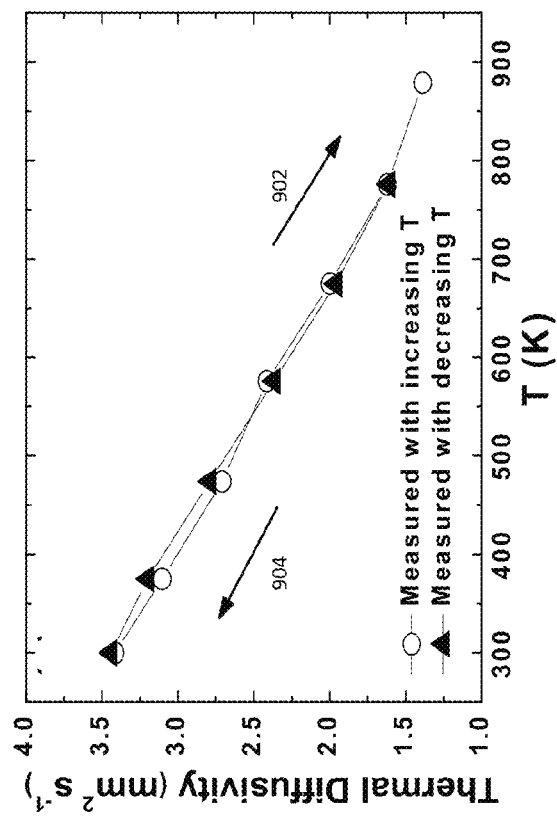
Figure 9F:
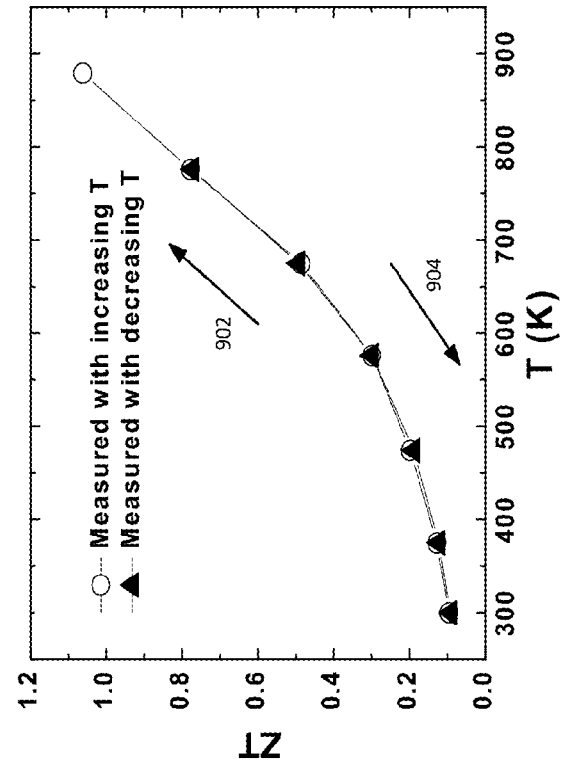
Figure 9E:
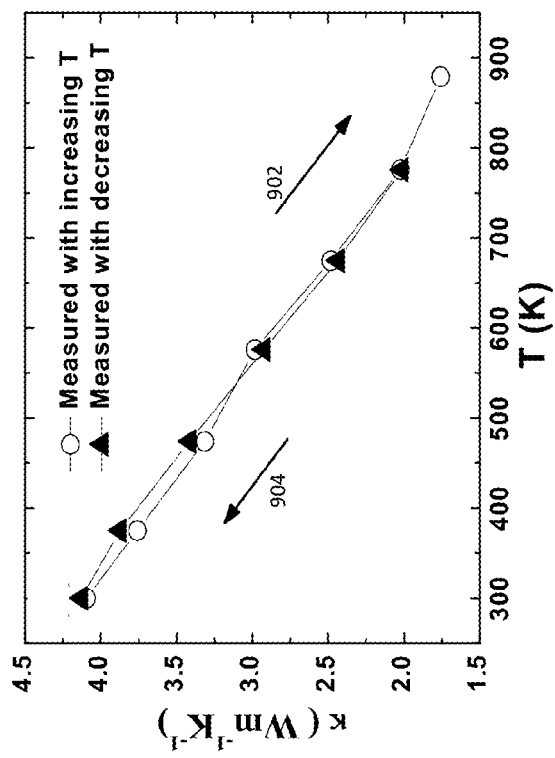

FIGS. 9A-9F illustrate the reliability of the thermoelectric properties of a sample of In-doped SnTe. Specifically, FIGS. 9A-9F illustrate the thermoelectric properties of $In_{0.0025}Sn_{0.9975}Te$. FIG. 9A illustrates the relationship between electrical conductivity ($\sigma$) and temperature under both conditions of increasing 902 and decreasing 904 temperatures. The measurements for the increasing 902 and decreasing 904 temperatures overlap as illustrated in FIG. 9A, indicating that the electrical conductivity measurements may not vary substantially when temperatures are increased 902 as compared to when temperatures are decreased 904. FIG. 9B illustrates the impact of increasing 902 and decreasing 904 temperatures on the Seebeck coefficient (S), FIG. 9C illustrates the impact of increasing 902 and decreasing 904 temperatures on the power factor, FIG. 9D illustrates the impact of increasing 902 and decreasing 904 temperatures on the thermal diffusivity, FIG. 9E illustrates the effect of increasing 902 and decreasing 904 temperatures on the thermal conductivity, and FIG. 9F illustrates the effect of increasing 902 and decreasing 904 temperatures on the dimensionless figure of merit (ZT). As shown in FIGS. 9A-9F, the measurements taken for each characteristic (electrical conductivity, Seebeck coefficient, power factor, thermal diffusivity, thermal conductivity, and ZT) indicate that the measurements taken when the temperature is increased 902 or decreased 904 may be substantially similar, as shown by the at least partially overlapping trend lines in each figure.

FIGS. 10A-10E illustrate the thermoelectric properties of samples of SnTe of varying compositions. In FIGS. 10A-10E, samples of SnTe of the compositions as indicated in Table 1 were used:

TABLE 1

Compositions of SnTe samples

| Sample | Sn | Te |
|---|---|---|
| 1 | 0.984 | 1.016 |
| 2 | 0.992 | 1.008 |
| 3 | 1 | 1 |
| 4 | 1.008 | 0.992 |
| 5 | 1.016 | 0.984 |

Figure 10A:
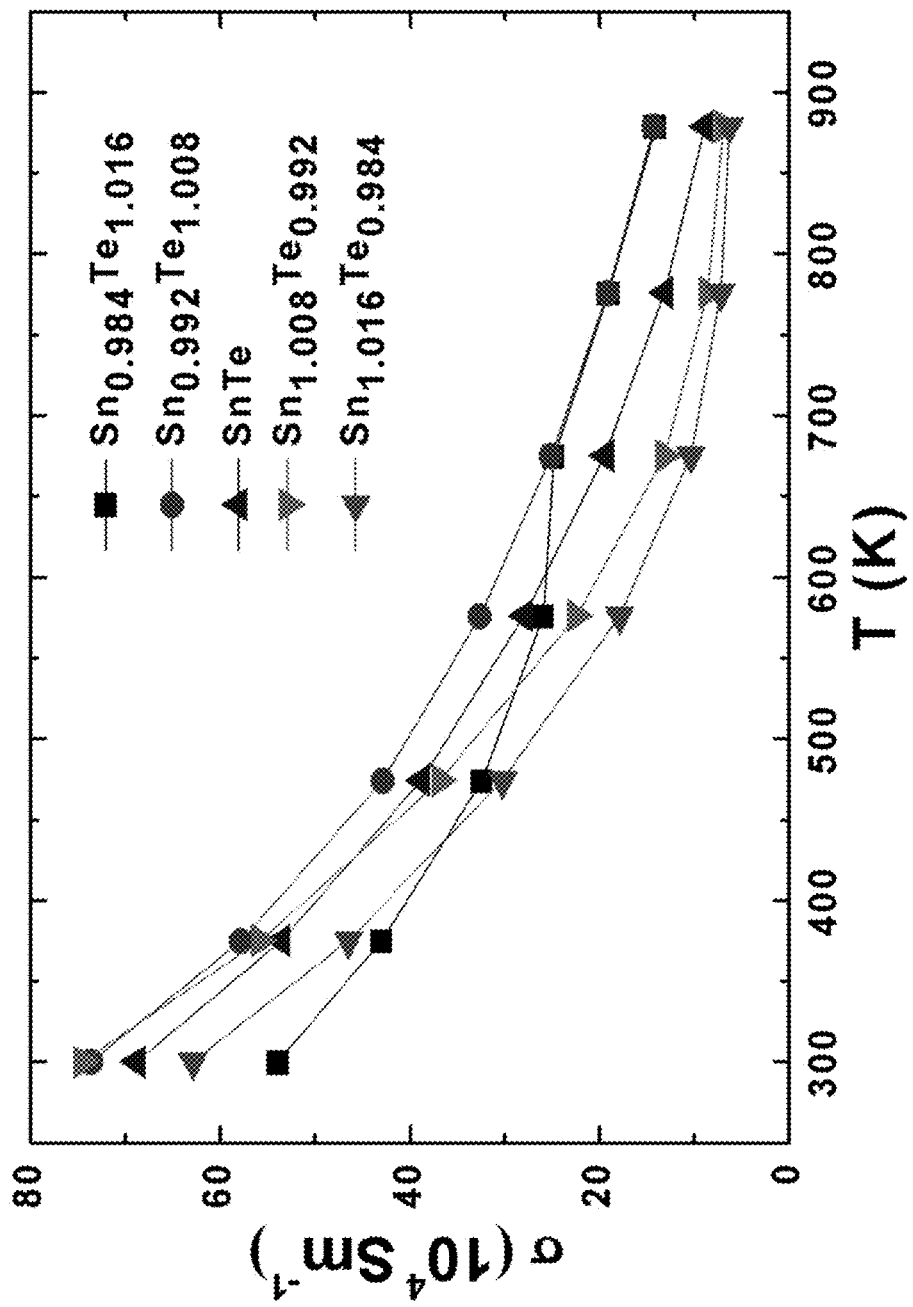

The very high carrier concentration of SnTe in various combinations may be due to the Sn vacancies, which may lead to lower Seebeck values and higher electrical conductivity. Therefore, different ratios of Sn and Te were fabricated to adjust the carrier concentration. With different nominal compositions, the thermoelectric properties varied. For example, as illustrated in FIG. 10A, the electrical conductivity decreased with increasing content of Sn, which is due to the decrease of Sn vacancies.

Figure 10B:
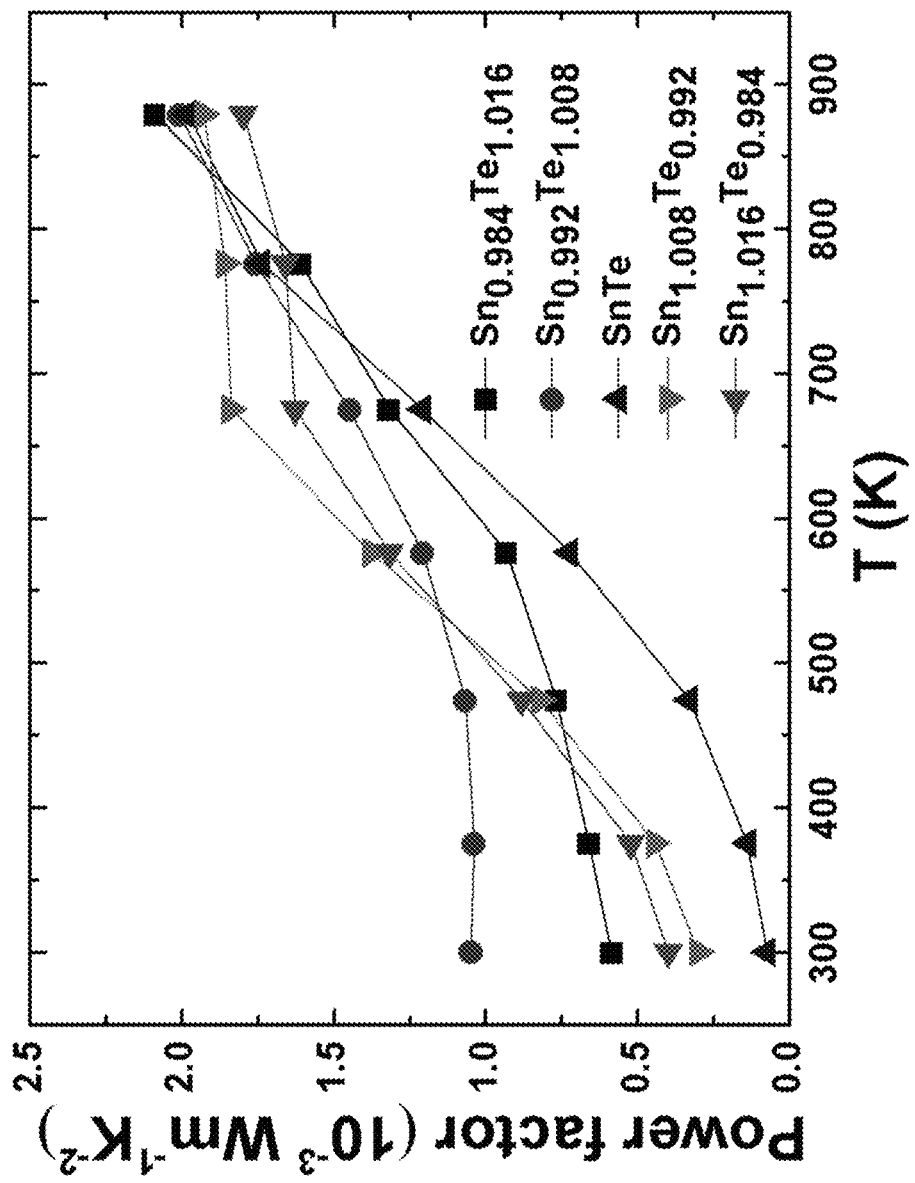
Figure 10C:
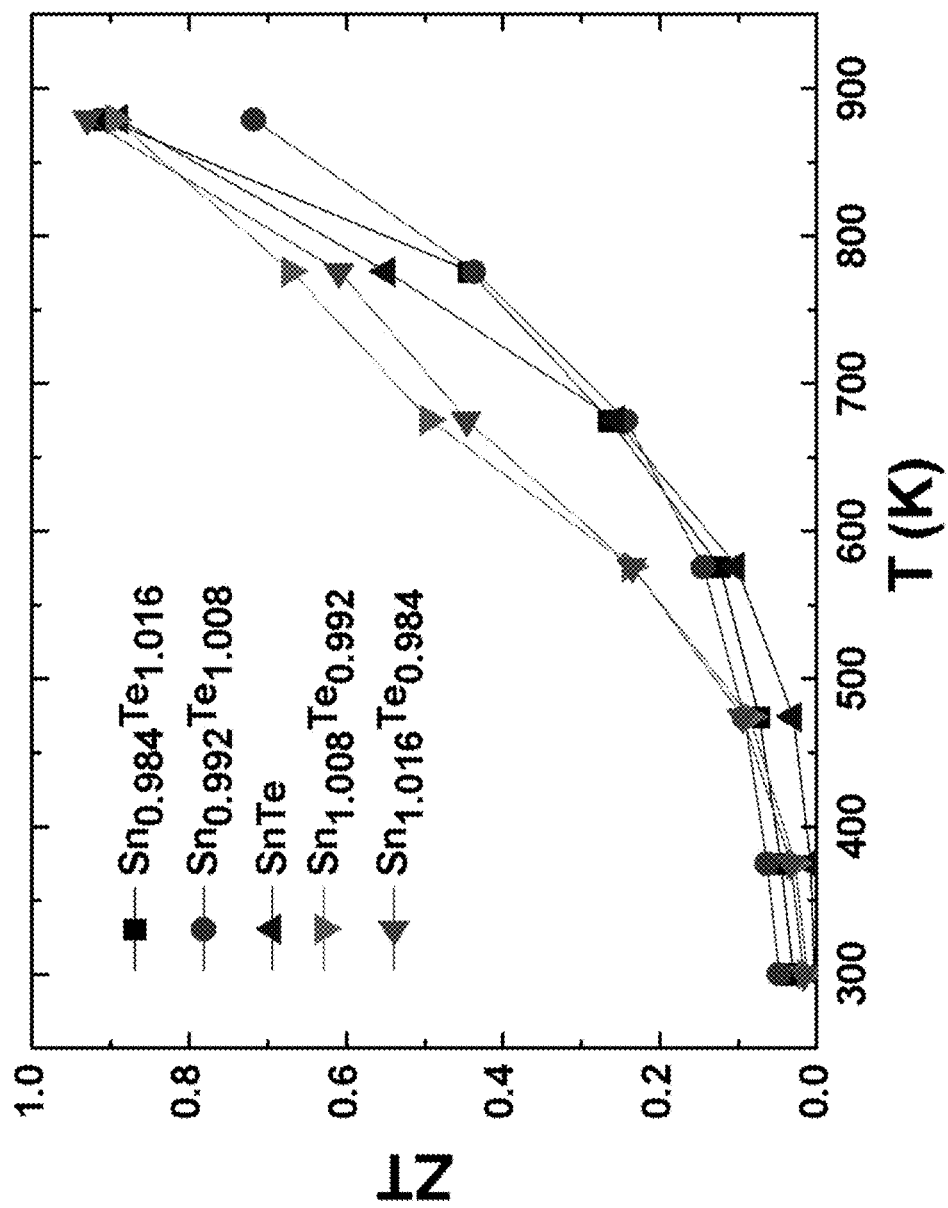
Figure 10E:
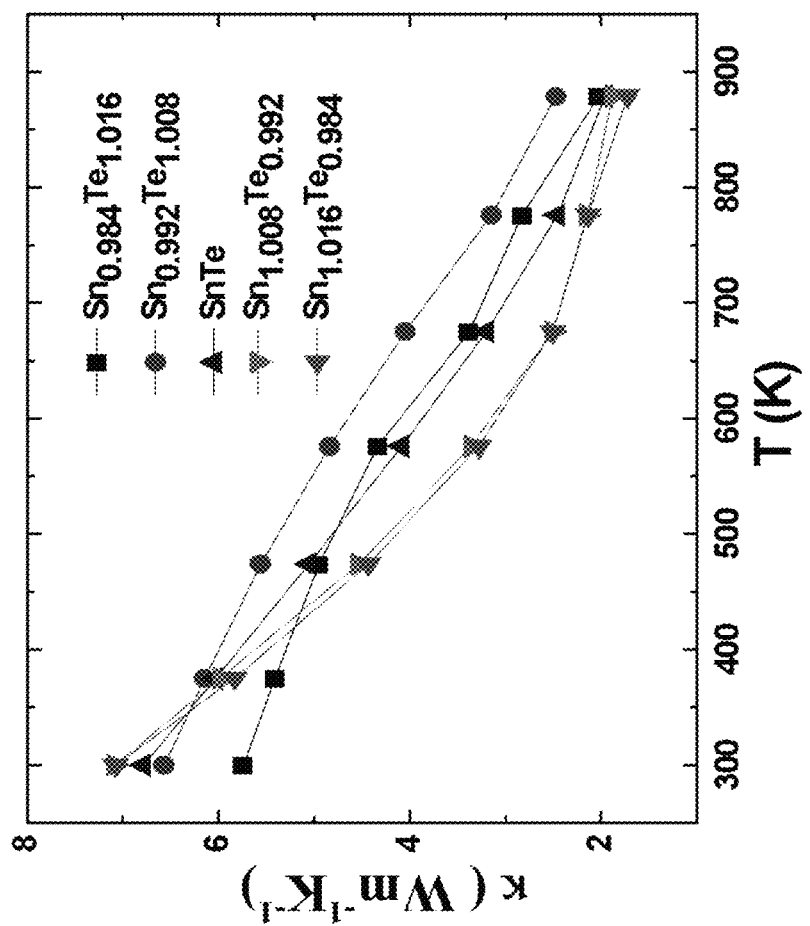

FIG. 10B illustrates the impact of concentration change on the power factor, and FIG. 10C illustrates the impact of concentration change on the average ZT is that the average ZT was increased by the increasing concentration of Sn. However, FIG. 10C illustrates the general increase of the average ZT as the balance between Sn and Te tips towards a larger concentration of Sn. FIG. 10D illustrates that, as the Sn concentration increases relative to the Te concentration and therefore reduces the Sn vacancies, the Seebeck coefficient increased, and FIG. 10E illustrates the thermal conductivity decreasing as the concentration of Sn increases relative to that of Te.

Figure 11A:
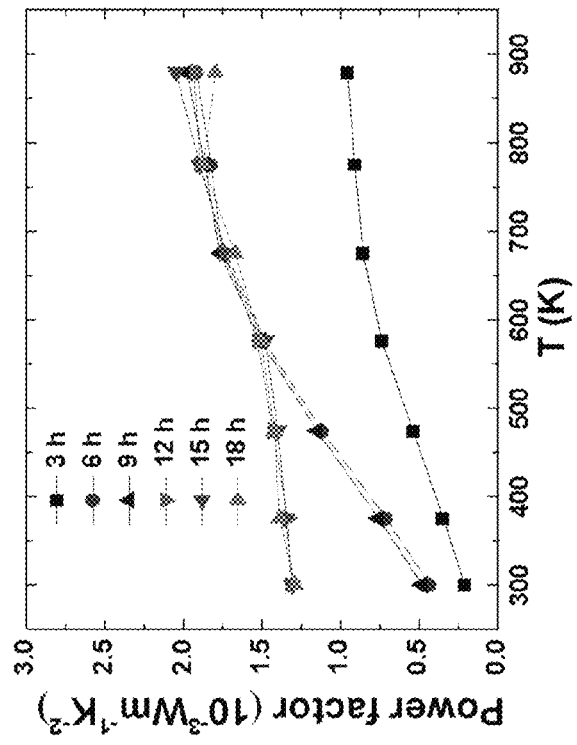
FIGS. 11A-11F illustrate thermoelectric properties of In-doped SnTe samples ball-milled for various times and synthesized according to certain embodiments of the present disclosure.
Figure 11B:
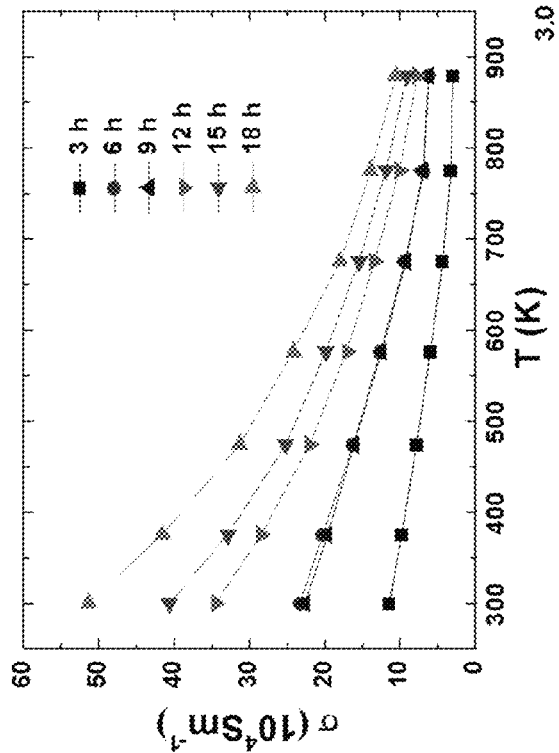
Figure 11C:
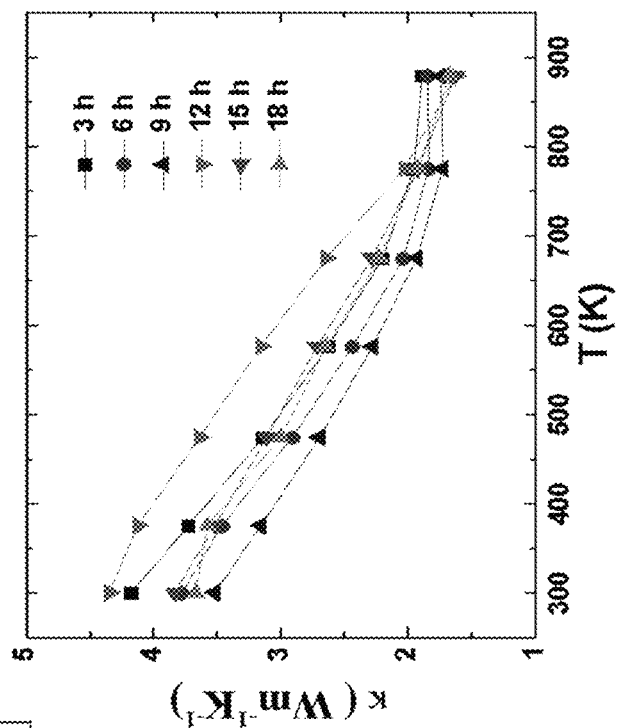
Figure 11D:
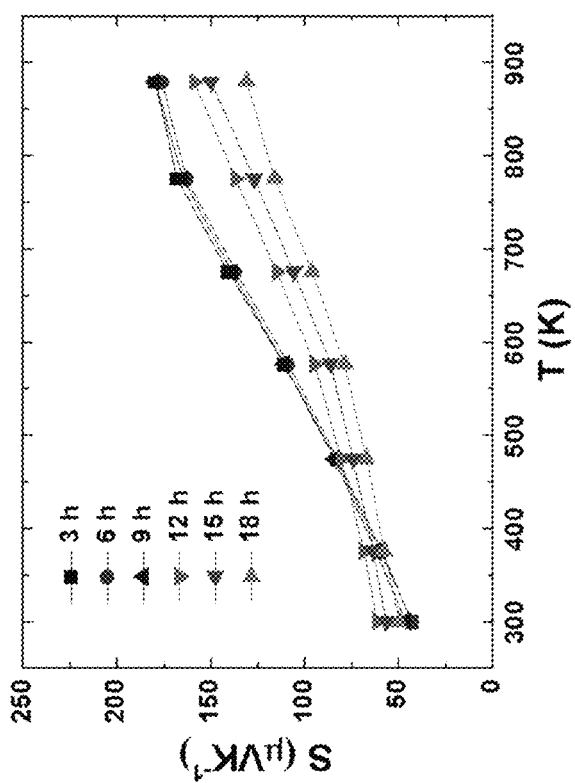
Figure 11E:
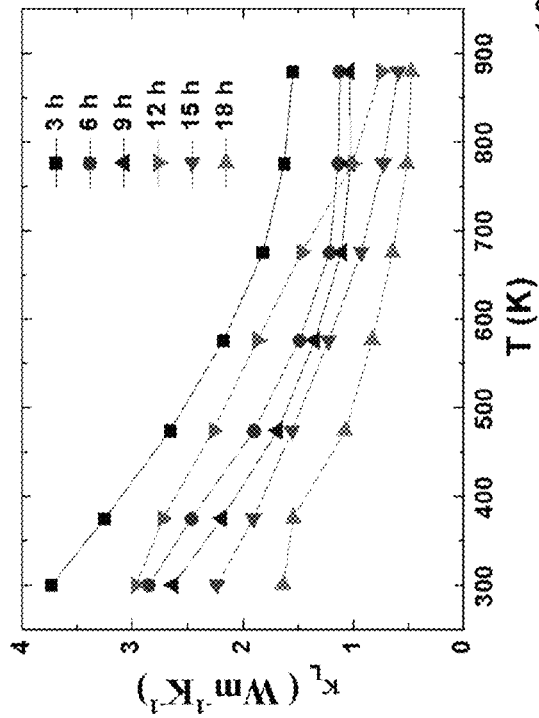
Figure 11F:
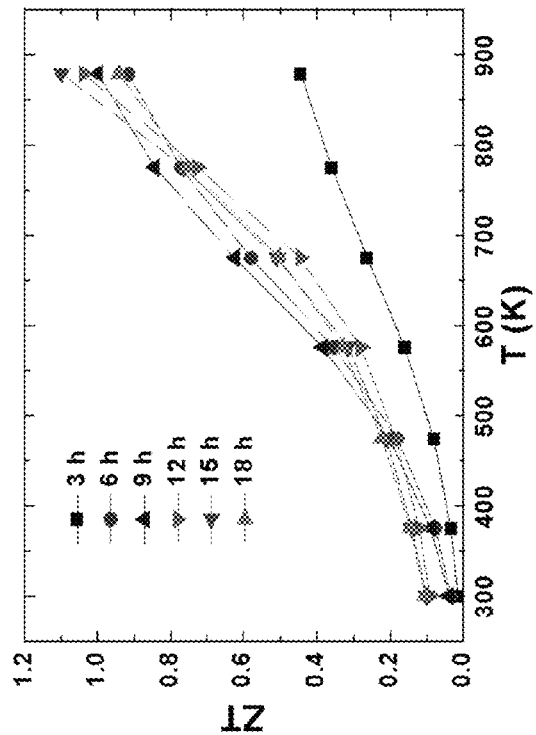

FIGS. 11A-11F illustrate thermoelectric properties of In-doped SnTe samples ball-milled for various times and synthesized according to embodiments of the present disclosure. Since the TE properties of In-doped SnTe increased when ball milled, samples were synthesized with ball milling times from 3 hours (h) to 18 h in order to better evaluate the detailed effect of ball milling. All the raw materials In (powder, 99.99%), Sn (powder, 99.9%), and Te (chunks, 99.999%) were loaded into the jar directly and ball milled for certain time. The composition of the testing sample is $In_{0.005}Sn_{0.995}Te$. FIG. 11A illustrates that the electrical conductivity increased with increasing ball milling time and FIG. 11C illustrates the Seebeck coefficient decreased. However, is it noted in FIG. 11C that the room temperature Seebeck coefficient increased. FIG. 11B illustrates that the average power factor increased with increasing ball milling time, in particular the increase from the 3 h sample and the 6 h sample. FIG. 11E illustrates that the lattice thermal conductivity was naturally decreased by ball milling due to the greatly decreased grain size (See SEM in FIGS. 12A-12E). At last, as illustrated in FIG. 11F both the highest ZT and the average ZT were increased with increasing ball-milling time. A peak ZT ~1.1 at about 873 K was obtained by ball milling for about 15 h.

Figure 13B:
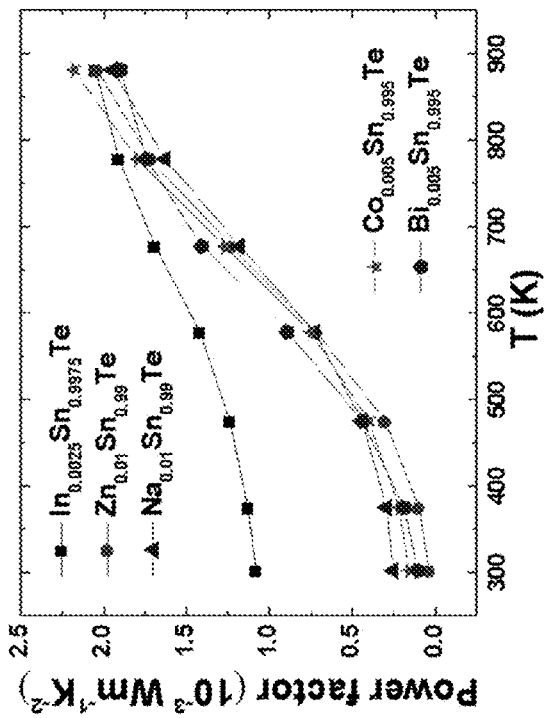
FIGS. 13A-13E illustrate thermoelectric properties for SnTe samples doped with various elements and synthesized according to certain embodiments of the present disclosure.
Figure 13A:
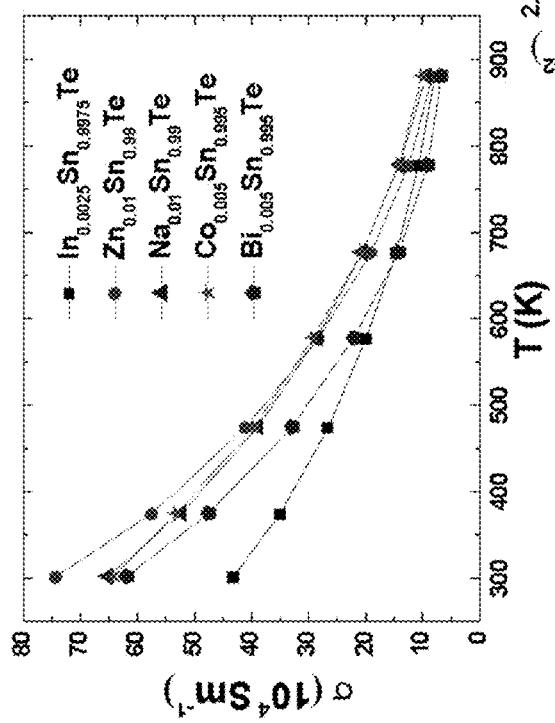
Figure 13C:
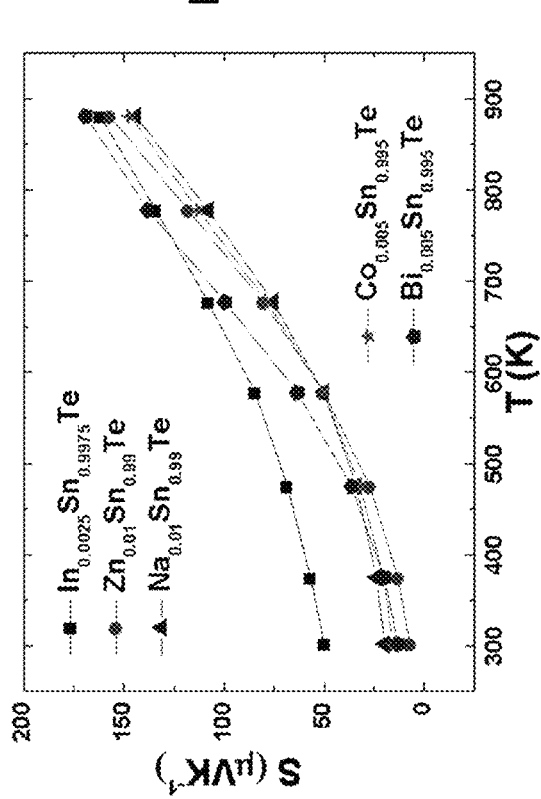
Figure 13D:
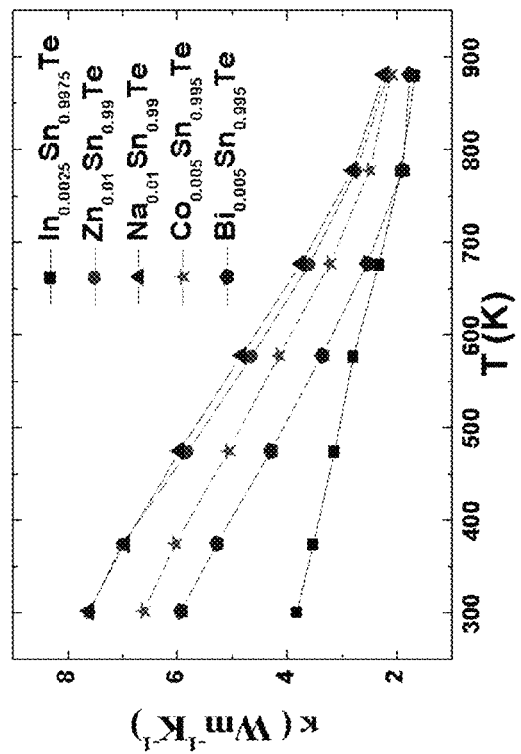
Figure 13E:
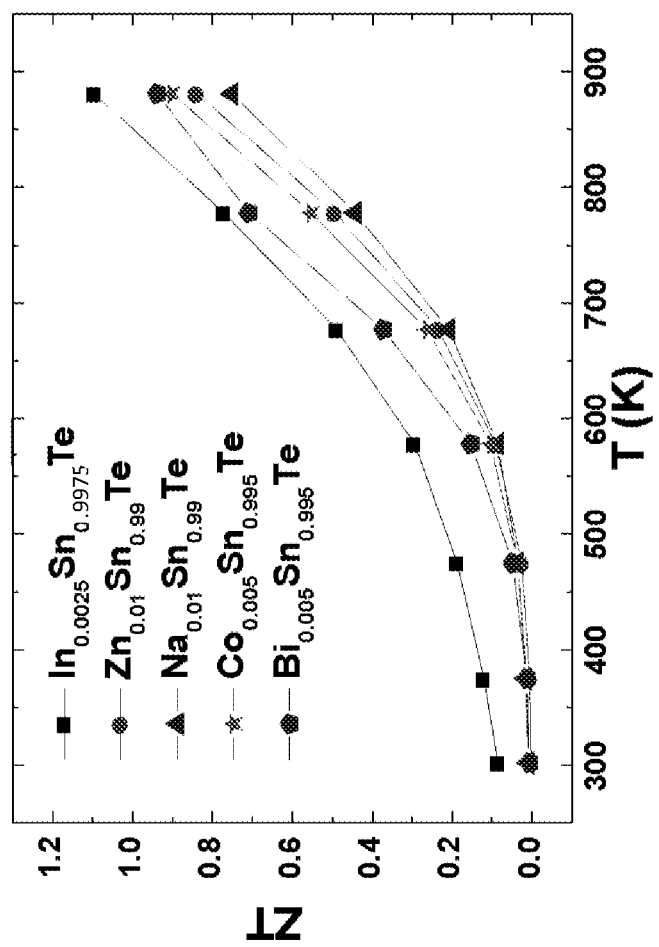

Turning to FIGS. 12A-12E, FIG. 12A is an SEM image of a sample ball milled for 3 h, FIG. B is an SEM image of a sample ball milled for 6 h, FIG. 12C is an SEM image of a sample ball milled for 9 h, FIG. 12D is an SEM image of a sample ball milled for 12 h, and FIG. 12E is an SEM image of a sample ball milled for 15 h. The SEM images each comprise a scale, the measurement of which has been exploded for ease of review. FIGS. 12A-12E illustrate that when a ball milling time is greater than about 9 h (FIG. 12C), the grain size may start to decrease. In a preferred embodiment, a ball-milling time may range from about 12 h to about 15 h. As discussed herein, various dopants including but not limited to boron (B), aluminum (Al), bismuth (Bi), zinc (Zn), sodium (Na), cobalt (Co), gallium (Ga), thallium (Tl), silicon (Si), germanium (Ge), lead (Pb), or indium (In). FIGS. 13A-13E illustrate thermoelectric properties for SnTe samples doped with various elements and synthesized according to embodiments of the present disclosure. In FIGS. 13A-13E, several dopants were selected and samples synthesized according to embodiments of the present disclosure. In the embodiments illustrated in FIGS. 13A-13E, dopants including In, Zn, Na, Co, and Bi were chosen for the optimization of the TE properties. FIG. 13A illustrates the comparative electrical conductivity of the samples doped with the chosen dopants, FIG. 13B illustrates the comparative power factor of the samples doped with the chosen dopants, FIG. 13C illustrates the comparative Seebeck coefficient of the samples doped with the chosen dopants, FIG. 13D illustrates the thermal conductivity of the samples doped with the chosen dopants, and FIG. 13E illustrates the ZT of the samples doped with the chosen dopants.

FIG. 14 is a flow chart of a method of manufacturing doped SnTe thermoelectric compositions according to some embodiments of the present disclosure. In method 1400, a thermoelectric material comprising SnTe and at least one dopant is manufactured according to embodiments of the present disclosure. In one embodiment, a plurality of components including Sn, Te, and at least one dopant that may be boron (B), aluminum (Al), bismuth (Bi), zinc (Zn), sodium (Na), cobalt (Co), gallium (Ga), thallium (Tl), silicon (Si), germanium (Ge), lead (Pb), or indium (In), are ball-milled from about 3 hours to about eighteen hours. In alternate embodiments, components are ball-milled from about 12 hours to about 15 hours, and in still other embodiments, the components are ball-milled for a range of time within the range of about 3 hours to about 12 hours. Subsequent to ball-milling, at block 1414, the ball-milled components may undergo thermal-mechanical processing. This processing may comprise one or more steps and one or more processes that may be the same or different, these processes may include rolling, pressing, extrusion, or other known thermal-mechanical processes. Subsequent to at least one of ball-milling at block 1402 and thermal-mechanically processing at block 1414, the fabricated thermoelectric material may comprise a ZT of greater than 0.8.

In an alternate embodiment, the balling milling at block 1402 may comprise a plurality of steps. The number of steps and length of time of each step and overall for the ball milling process may be determined by the composition, the desired phase, the desired properties of the end product, the equipment utilized, or combinations thereof. In one example, a first subset of components are ball-milled at block 1404, a component subset may comprise as few as one component or as many as all of the components of the plurality of components, if all of the components are used at bloc 1404, it may be because they are ball-milled together in smaller batches and then combined at block 1412. In another example, a first subset of components are ball-milled at block 1410, a second subset of components, which may overlap in whole or in part the first subset of components, may be ball-milled at block 1410. If the second subset of components is not ball milled at block 1410 with the first subset of components, the two subsets may be combined at block 1412 where they may be further ball milled or otherwise combined. At block 1414, the thermal mechanical processing may proceed as described herein.

In yet another embodiment, the first subset of components at block 1404 is ball milled, and at least one additional component may be added at block 1406 and then ball-milled at block 1408. This step may be repeated in order to add additional components including dopants, which may be the same or different from the previously added components. At block 1414, the ball milled components are thermal-mechanically processed as described above.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. Use of the term "optionally" with respect to any element of a claim means that the element is required, or alternatively, the element is not required, both alternatives being within the scope of the claim. Use of broader terms such as "comprises," "includes," and "having" should be understood to provide support for narrower terms such as "consisting of," "consisting essentially of," and "comprised substantially of" Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present invention.

While certain exemplary embodiments have been shown and described, modifications thereof can be made by one skilled in the art without departing from the scope or teachings herein. The embodiments described herein are exemplary only and are not limiting. Many variations and modifications of the compositions, systems, apparatus, and processes described herein are possible and are within the scope of the invention as defined by the claims below. Accordingly, the scope of protection is not limited to the exemplary embodiments described herein, but is only limited by the claims that follow, the scope of which shall include all equivalents of the subject matter of the claims. Unless expressly stated otherwise, the steps in a method claim may be performed in any order. The recitation of identifiers such as (a), (b), (c) or (1), (2), (3) before steps in a method claim are not intended to and do not specify a particular order to the steps, but rather are used to simplify subsequent reference to such steps.

What is claimed is:

1. A thermoelectric material comprising:
   tin (Sn), tellurium (Te), and a dopant (D) according to the formula $D_xSn_{1-x}Te$;
   wherein the dopant (D) comprises indium and x is from 0.001 to 0.005; and
   wherein a Seebeck coefficient of the thermoelectric material is at least about 50 μV/K.

2. The thermoelectric material of claim 1, wherein x is from 0.001 to 0.003.

3. The thermoelectric material of claim 1, further comprising an average grain size from about 50 nm to about 10 microns.

4. A thermoelectric material comprising:
   tin (Sn), tellurium (Te), and indium (In) according to the formula $In_xSn_{1-x}Te$;
   wherein x is from 0.001 to 0.005;
   wherein a dimensionless figure of merit (ZT) of the thermoelectric material is at least about 0.8; and
   wherein the thermoelectric material does not comprise lead (Pb).

5. The thermoelectric material of claim 4, wherein x is from 0.001 to 0.003.

6. The thermoelectric material of claim 4, further comprising an average grain size from about 50 nm to about 10 microns.

* * * * *